(12) United States Patent
Jeong et al.

(10) Patent No.: US 12,148,841 B2
(45) Date of Patent: Nov. 19, 2024

(54) THIN FILM TRANSISTOR ARRAY SUBSTRATE AND DISPLAY DEVICE

(71) Applicant: LG Display Co., Ltd., Seoul (KR)

(72) Inventors: Chanyong Jeong, Paju-si (KR); Juheyuck Baeck, Seoul (KR); Dohyung Lee, Paju-si (KR); Younghyun Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 706 days.

(21) Appl. No.: 17/340,937

(22) Filed: Jun. 7, 2021

(65) Prior Publication Data

US 2021/0399142 A1    Dec. 23, 2021

(30) Foreign Application Priority Data

Jun. 22, 2020   (KR) .................. 10-2020-0076064

(51) Int. Cl.
*H01L 29/786* (2006.01)

(52) U.S. Cl.
CPC .. *H01L 29/78696* (2013.01); *H01L 29/78618* (2013.01); *H01L 29/78633* (2013.01)

(58) Field of Classification Search
None
See application file for complete search history.

(56) References Cited

U.S. PATENT DOCUMENTS

| | | | |
|---|---|---|---|
| 9,287,117 B2 | 3/2016 | Yamazaki et al. | |
| 10,002,971 B2 | 6/2018 | Jintyou et al. | |
| 10,672,849 B2 | 6/2020 | Lee | |
| 10,872,982 B2 | 12/2020 | Ohno et al. | |
| 2013/0221345 A1 | 8/2013 | Ohno et al. | |
| 2014/0103337 A1* | 4/2014 | Yamazaki | H10B 41/70 257/43 |
| 2016/0005873 A1* | 1/2016 | Jintyou | H01L 29/78621 257/43 |
| 2016/0163880 A1 | 6/2016 | Ohno et al. | |
| 2018/0151654 A1* | 5/2018 | Lee | H10K 59/1216 |

(Continued)

FOREIGN PATENT DOCUMENTS

| | | | | |
|---|---|---|---|---|
| JP | 2003142496 A | * | 5/2003 | .......... H01L 21/336 |
| JP | 2016-027649 A | | 2/2016 | |
| KR | 10-2015-0067207 A | | 6/2015 | |

(Continued)

OTHER PUBLICATIONS

English translation of JP 2003142496 A; 2003 (Year: 2003).*

(Continued)

*Primary Examiner* — Suberr L Chi
*Assistant Examiner* — Carnell Hunter, III
(74) *Attorney, Agent, or Firm* — Fenwick & West LLP

(57) ABSTRACT

Embodiments of the present disclosure relate to a thin film transistor array substrate and display device in which a semiconductor layer has a heterogeneous conductorization structure including heterogeneous conductorization portions having different electrical conductivity, and the gate insulator layer is not etched enough to expose the semiconductor layer between the source electrode part and the gate electrode part and between the drain electrode part and the gate electrode part, so that the possibility of damage to the semiconductor layer can be eliminated or reduced.

24 Claims, 19 Drawing Sheets

(56) References Cited

U.S. PATENT DOCUMENTS

2020/0119120 A1    4/2020  Feng et al.
2021/0327964 A1*   10/2021 Jeon ..................... H10K 50/844

FOREIGN PATENT DOCUMENTS

KR    10-2018-0061723 A    6/2018
KR    10-2020-0037195 A    4/2020

OTHER PUBLICATIONS

Korean Intellectual Property Office, Office Action, Korean Patent Application No. 10-2020-0076064, Mar. 15, 2024, 10 pages, (with concise explanation of relevance).

* cited by examiner

THIN FILM TRANSISTOR ARRAY SUBSTRATE AND DISPLAY DEVICE

CROSS REFERENCE TO RELATED APPLICATION

This application claims priority from Republic of Korea Patent Application No. 10-2020-0076064, filed on Jun. 22, 2020, which is hereby incorporated by reference in its entirety.

BACKGROUND

Technical Field

The present disclosure relates to a thin film transistor array substrate and a display device.

Description of the Prior Art

Transistors are widely used as switching devices or driving devices in the field of electronic devices. In particular, since a thin film transistor can be manufactured on a glass substrate or a plastic substrate, the thin film transistor may be widely used as a switching element of display devices such as a liquid crystal display device or an organic light emitting display device.

The thin film transistor may be classified, based on the material constituting an active layer, into an amorphous silicon thin film transistor using amorphous silicon as the active layer, a polycrystalline silicon thin film transistor using polycrystalline silicon as the active layer, and an oxide semiconductor thin film transistor using an oxide semiconductor as the active layer.

Since amorphous silicon can be deposited in a short time to form an active layer, an amorphous silicon thin film transistor (a-Si TFT) has the advantage of short manufacturing process time and low production cost. On the other hand, since the current driving capability is relatively low due to the low mobility, and the amorphous silicon thin film transistor has a disadvantage that it is limited to an organic light emitting display device due to a change in the threshold voltage.

A polycrystalline silicon thin film transistor (poly-Si TFT) is made by crystallizing amorphous silicon after depositing the amorphous silicon. In the process of manufacturing a polycrystalline silicon thin film transistor, a crystallization process of amorphous silicon is required, so the number of processes increases and the manufacturing cost increases. In addition, since the crystallization process is performed at a high process temperature, the polycrystalline silicon thin film transistor is difficult to apply to a large area device. Further, it is difficult to secure the uniformity of the polycrystalline silicon thin film transistor due to the polycrystalline characteristics.

Since oxides constituting an active layer can be formed at a relatively low temperature, the oxide has high mobility and a large resistance change depending on the content of oxygen, oxide semiconductor thin film transistors have the advantage that desired physical properties can be easily obtained. In addition, due to the characteristic of the oxide, the oxide semiconductor is transparent, so it is also advantageous to implement a transparent display. However, in order to apply the oxide semiconductor layer to the thin film transistor, it is required a separate conductorization process for forming a connection portion between a source electrode and a drain electrode.

Meanwhile, when forming a thin film transistor, a gate insulator layer is formed on the semiconductor layer, and the gate insulator layer is etched for various reasons. In this case, there may be a risk that the semiconductor layer is lost, damaged, or cut off during the etching process of the gate insulator layer.

SUMMARY

Embodiments of the present disclosure may provide a thin film transistor array substrate and a display device including a thin film transistor having a structure in which the possibility of damage to the semiconductor layer can be eliminated or reduced.

Embodiments of the present disclosure may provide a thin film transistor array substrate and a display device including a thin film transistor having a structure capable of simultaneously providing excellent electrical characteristics (e.g., current characteristics, mobility, etc.) while eliminating or reducing the possibility of damage to the semiconductor layer.

Embodiments of the present disclosure may provide a thin film transistor array substrate and a display device including a thin film transistor having a structure capable of reducing the formation of parasitic capacitance.

Embodiments of the present disclosure may provide a thin film transistor array substrate and a display device having a structure capable of forming a capacitor with a thin thickness.

Embodiments of the present disclosure may provide a thin film transistor array substrate comprising: a semiconductor layer including a channel portion, a first conductorization portion located on at one a first side of the channel portion, and a second conductorization portion located on at the a other second side of the channel portion that is opposite the first side, wherein the first conductorization portion including includes a first main conductorization portion and a first sub-conductorization portion, and the second conductorization portion including includes a second main conductorization portion and a second sub-conductorization portion; a gate insulator layer disposed on the semiconductor layer and including and having a first contact hole and a second contact hole, to the first contact hole exposing e a portion of the first main conductorization portion and a the second contact hole to exposing a portion of the second main conductorization portion; a main source electrode on the gate insulator layer, the main source electrode electrically connected to the first main conductorization portion through the first contact hole; a main drain electrode on the gate insulator layer, the main drain electrode electrically connected to the second main conductorization portion through the second contact hole; a main gate electrode on the gate insulator layer, the main gate electrode overlapping the channel portion; and a functional insulating layer on the main source electrode, the main gate electrode, and the main drain electrode, wherein the first sub-conductorization portion is located between the first main conductorization portion and the channel portion, the first sub-conductorization portion non-overlapping with the main source electrode and the main gate electrode and having an electrical conductivity different from an electrical conductivity of the first main conductorization portion, wherein the second sub-conductorization portion is located between the second main conductorization portion and the channel portion, the second sub-conductorization portion non overlapping with the main drain electrode and the main gate electrode and having an electrical conductivity different from an electrical conductivity of the second main conductorization portion, and wherein the gate insulator layer is between the first sub-conductorization portion and the functional insulating layer, and is between the second sub-conductorization portion and the functional insulating layer.

A thin film transistor array substrate comprising: a semiconductor layer including a channel portion, a first main conductorization portion at a first side of the channel portion, a second main conductorization portion at a second side of the channel portion that is opposite the first side, a first sub-conductorization portion between the first main conductorization portion and the channel portion, and a second sub-conductorization portion between the second main conductorization portion and the channel portion; a source electrode electrically connected to the first main conductorization portion; a drain electrode electrically connected to the second main conductorization portion; and a gate electrode between the source electrode and the drain electrode, the gate electrode overlapping the channel portion; wherein an electrical conductivity of the first sub-conductorization portion is different from an electrical conductivity of the first main conductorization portion, and an electrical conductivity of the second sub-conductorization portion is different from an electrical conductivity of the second main conductorization portion.

DETAILED DESCRIPTION

Figure 1:
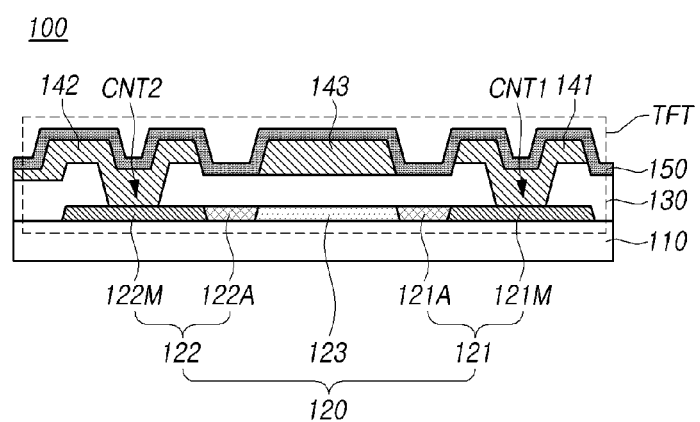
FIG. 1 is a cross-sectional view illustrating a structure of a thin film transistor formed on a thin film transistor array substrate according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, it will be described a thin film transistor array substrate 100 and a display device including the same according to exemplary embodiments in detail with reference to the drawings.

FIG. 1 is a cross-sectional view illustrating a structure of a thin film transistor formed on a thin film transistor TFT array substrate 100 according to embodiments of the present disclosure.

Referring to FIG. 1, the thin film transistor TFT array substrate 100 according to embodiments of the present disclosure may include a semiconductor layer 120, a gate insulator layer 130, a main source electrode 141, a main drain electrode 142, a main gate electrode 143, a functional insulating layer 150, and the like.

Referring to FIG. 1, the semiconductor layer 120 may be disposed on a substrate 110. The substrate 110 may be a glass substrate or a plastic substrate. The substrate 110 may be a flexible substrate, a bendable substrate, or a stretchable substrate.

Referring to FIG. 1, the semiconductor layer 120 may include a channel portion 123, a first conductorization portion 121 located on one side of the channel portion 123, and a second conductorization portion 122 located on the other side of the channel portion 123. For example, the semiconductor layer 120 may be an oxide semiconductor layer, and in some cases, may be a polycrystalline silicon semiconductor layer or an amorphous silicon semiconductor layer.

Referring to FIG. 1, the first conductorizatioon portion 121 may include a first main conductorization portion 121M and a first sub-conductorization portion 121A. The second conductorization portion 122 may include a second main conductorization portion 122M and a second sub-conductorization portion 122A.

The first main conductorization portion 121M and the second main conductorization portion 122M are connection portions electrically connected to the main source electrode 141 and the main drain electrode 142, respectively. The first sub-conductorization portion 121A and the second sub-conductorization portion 122A are not connected to the main source electrode 141 and the main drain electrode 142, but have different electrical characteristics from the channel portion 123, and have a conductorized characteristic like the first sub-conductorization portion 121A and the second sub-conductorization portion 122A.

Referring to FIG. 1, the gate insulator layer 130 may be disposed on the semiconductor layer 120. The gate insulator layer 130 may have a first contact hole CNT1 such that a portion of the first main conductorization portion 121M is exposed, and a second contact hole CNT2 such that a portion of the second main conductorization portion 122M is exposed.

Referring to FIG. 1, the main source electrode 141, the main drain electrode 142, and the main gate electrode 143 may be located on the gate insulator layer 130. For example, the main source electrode 141, the main drain electrode 142, and the main gate electrode 143 may be located on the same layer and may be made of the same material.

Referring to FIG. 1, the main source electrode 141 may be electrically connected to the first main conductorization portion 121M through the first contact hole CNT1. The main drain electrode 142 may be electrically connected to the second main conductorization portion 122M through the second contact hole CNT2. The main gate electrode 143 may overlap the channel portion 123.

Referring to FIG. 1, the functional insulating layer 150 may be disposed on the main source electrode 141, the main gate electrode 143, and the main drain electrode 142.

For example, referring to FIG. 1, the functional insulating layer 150 may be disposed to cover the main source electrode 141, the main gate electrode 143, and the main drain electrode 142. Thai is, the functional insulating layer 150 may be positioned on the upper and side surfaces of eash of the main source electrode 141, the main gate electrode 143 and the main drain electrode 142, and may also be positioned on a portion of the gate insulator layer 130.

Referring to FIG. 1, the first sub-conductorization portion 121A may be positioned between the first main conductorization portion 121M and the channel portion 123 along the horizontal plane. The second sub-conductorization portion 122A may be positioned between the second main conductorization portio 122M and the channel portion 123 along the horizontal plane.

Referring to FIG. 1, the first sub-conductorization portion 121A may not overlap the main source electrode 141 and the main gate electrode 143. For this reason, a metal material layer does not exist between the first sub-conductorization portion 121A of the semiconductor layer 120 and the functional insulating layer 150. Accordingly, as will be described later, the first sub-conductorization portion 121A of the semiconductor layer 120 may receive hydrogen from the functional insulating layer 150 and may be conductorized by the supplied hydrogen.

Referring to FIG. 1, the second sub-conductorization portion 122A may not overlap the main source electrode 141 and the main drain electrode 142. For this reason, a metal material layer does not exist between the second sub-conductorization portion 122A of the semiconductor layer 120 and the functional insulating layer 150. Accordingly, as will be described later, the second sub-conductorization portion 122A of the semiconductor layer 120 may receive hydrogen from the functional insulating layer 150 and may be conductorized by the supplied hydrogen.

Referring to FIG. 1, the first sub-conductorization portion 121A and the functional insulating layer 150 may be spaced apart by the gate insulator layer 130. The second sub-conductorization portion 122A and the functional insulating layer 150 may be spaced apart by the gate insulator layer 130. That is, in the thin film transistor array substrate 100 according to the embodiments of the present disclosure, each thin film transistor TFT may have a structure (hereinafter, also referral to as a gate insulator layer etchless structure) in which the gate insulator layer 130 is not etched between the source contact region and the channel region, and between the drain contact region and the channel region.

Accordingly, loss of the semiconductor layer 120 of the thin film transistor TFT can be prevented or at least reduced, and it may be prevent a damage to the source contact portion between the main source electrode 141 and the first main conductoriztion portion 121M and a damage to the drain contact portion between the main drain electrode 142 and the second main conductorization portion 122M in the thin film transistor TFT.

Referring to FIG. 1, the first sub-conductorization portion 121A may have electrical conductivity different from that of the first main conductorization portion 121M. Therefore, according to the difference in electrical conductivity between the first main conductorization portion 121M and the first sub-conductorization portion 121A, the first main conductorization portion 121M and the first sub-conductorization portion 121A may be distinguished from each other in the first conductorization portion 121.

Referring to FIG. 1, the second sub-conductorization portion 122A may have electrical conductivity different from that of the second main conductorization portion 122M. Therefore, according to the difference in electrical conductivity between the second main conductorization portion 122M and the second sub-conductorization portion 122A, the second main conductorization portion 122M and the second sub-conductorization portion 122A may be distinguished from each other in the second conductorization portion 122.

Among the first main conductorization portion 121M, the first sub-conductorization portion 121A, and the channel portion 123, the first main conductorization portion 121M may have the largest electrical conductivity, and the electrical conductivity of the channel portion 123 may be the smallest.

Among the second main conductorization portion 122M, the second sub-conductorization portion 122A, and the channel portion 123, the electrical conductivity of the second main conductorization portion 122M may be the largest, and the electrical conductivity of the channel portion 123 may be the smallest.

Figure 2:
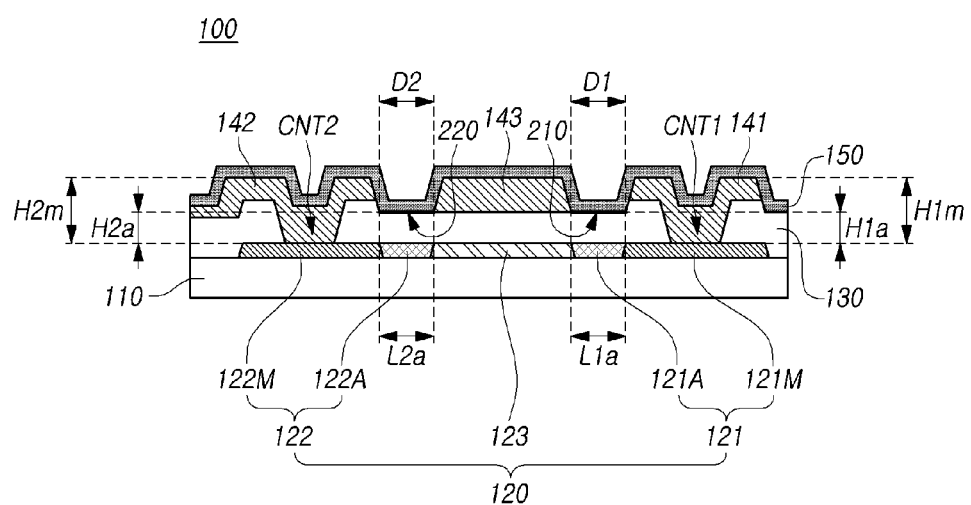
FIG. 2 is a cross-sectional view for explaining structural features of a thin film transistor formed on a thin film transistor array substrate according to embodiments of the present disclosure.

FIG. 2 is a cross-sectional view for explaining structural features of a thin film transistor TFT formed on a thin film transistor array substrate 100 according to embodiments of the present disclosure.

Referring to FIG. 2, in a region outside of the first contact hole CNT1, a vertical separation distance H1a between the first sub-conductorization portion 121A and the functional insulating layer 150 may be less than or equal to a vertical separation distance H1m between the first main conductorization portion 121M and the functional insulating layer 150. That is, the maximum vertical separation distance H1a between the first sub-conductorization portion 121A and the functional insulation layer 150 may be less than or equal to the maximum vertical separation distance H1m between the first main conductorization portion 121M and the functional insulation layer 150.

For example, in the case that the functional insulating layer 150 is disposed under a passivation layer 400 to be described later, in a region outside of the first contact hole CNT1, the vertical separation distance H1a between the first sub-conductorization portion 121A and the functional insulating layer 150 may be less than the vertical separation distance H1m between the first main conductorization portion 121M and the functional insulating layer 150.

For another example, in the case that the functional insulating layer 150 is disposed on the passivation layer 400 to be described later, in a region outside of the first contact hole CNT1, the vertical separation distance H1a between the first sub-conductorization portion 121A and the functional insulating layer 150 may correspond to the vertical separation distance H1m between the first main conductorization portion 121M and the functional insulating layer 150.

In a region outside of the second contact hole CNT2, a vertical separation distance H2a between the second sub-conductorization portion 122A and the functional insulating layer 150 may be less than or equal to a vertical separation distance H2m between the second main conductorization portion 122M and the functional insulating layer 150. That is, the maximum vertical separation distance H2a between the second sub-conductorization portion 122A and the functional insulation layer 150 may be less than or equal to the maximum vertical separation distance H2m between the second main conductorization portion 122M and the functional insulation layer 150.

For example, in the case that the functional insulating layer 150 is disposed under a passivation layer 400 to be described later, in a region other than the second contact hole CNT2, the vertical separation distance H2a between the second sub-conductorization portion 122A and the functional insulating layer 150 may be less than the vertical separation distance H2m between the second main conductorization portion 122M and the functional insulating layer 150.

For another example, in the case that the functional insulating layer 150 is disposed on the passivation layer 400 to be described later, in a region outside of the second contact hole CNT2, the vertical separation distance H2a between the second sub-conductorization portion 122A and the functional insulating layer 150 may correspond to the vertical separation distance H2m between the second main conductorization portion 122M and the functional insulating layer 150.

Referring to FIG. 2, the main gate electrode 143 and the main source electrode 141 may be spaced apart by a first horizontal separation distance D1 so as to expose a first upper surface 210 of the gate insulator layer 130 between the main gate electrode 143 and the main source electrode 141.

The main gate electrode 143 and a main drain electrode 142 may be spaced apart by a second horizontal separation distance D2 so as to expose a second upper surface 220 of the gate insulator layer 130 between the main gate electrode 143 and the main drain electrode 142.

Referring to FIG. 2, the first horizontal separation distance D1 may correspond to the length L1a of the first sub-conductorization portion 121A, and the second horizontal separation distance D2 may correspond to the length L2a of the second sub-conductorization portion 122A.

Referring to FIG. 2, the functional insulating layer 150 may contact the first upper surface 210 of the gate insulator layer 130 and may contact the second upper surface 220 of the gate insulator layer 130.

Referring to FIG. 2, since the first sub-conductorization portion 121A and the second sub-conductorization portion 122A are formed in the semiconductor layer 120, the length of the channel portion 123 of the semiconductor layer 120 may be shortened. Accordingly, it may be easy to implement a short channel of the thin film transistor TFT. Accordingly, mobility of the thin film transistor TFT may be improved.

Figure 3:
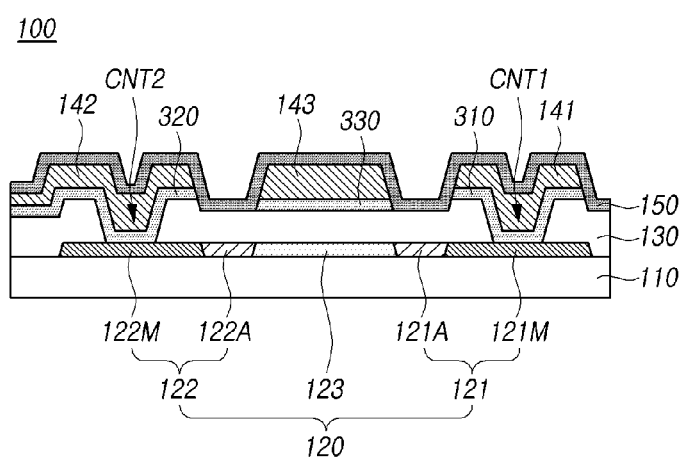
FIG. 3 is a cross-sectional view illustrating another structure of a thin film transistor formed on a thin film transistor array substrate according to embodiments of the present disclosure.

FIG. 3 is a cross-sectional view illustrating another structure of a thin film transistor TFT formed on a thin film transistor array substrate 100 according to embodiments of the present disclosure.

Referring to FIG. 3, a thin film transistor TFT formed on a thin film transistor array substrate 100 according to embodiments of the present disclosure may further include a first auxiliary source electrode 310, a first auxiliary drain electrode 320, and an auxiliary gate electrode 330.

The first auxiliary source electrode 310 is disposed between the gate insulator layer 130 and the main source electrode 141, may electrically contact with the main source electrode 141, and may electrically contact with the first main conductorization portion 121M through the first contact hole CNT1.

Accordingly, the main source electrode 141 may be electrically connected to the first main conductorization portion 121M through the first auxiliary source electrode 310.

The first auxiliary drain electrode 320 is disposed between the gate insulator layer 130 and the main drain electrode 142, may electrically contact with the main drain electrode 142, and may electrically contact with the second main conductorization portion 122M through the second contact hole CNT2.

Accordingly, the main drain electrode 141 may be electrically connected to the second main conductorization portion 122M through the first auxiliary drain electrode 320.

The auxiliary gate electrode 330 may be disposed between the gate insulator layer 130 and the main gate electrode 143, and may electrically contact the main gate electrode 143.

The auxiliary gate electrode 330 may overlap the channel portion 123.

Referring to FIG. 3, the first auxiliary source electrode 310 and the first auxiliary drain electrode 320 may include the same material as the auxiliary gate electrode 330, and may be positioned on the same layer. For example, the first auxiliary source electrode 310, the first auxiliary drain electrode 320, and the auxiliary gate electrode 330 may include an alloy material such as molybdenum-titanium (MoTi), and in some cases, may include a single metal material such as copper (Cu), aluminum (Al), molybdenum (Mo), or titanium (Ti).

The main source electrode 141 and the main drain electrode 142 may include the same material as the main gate electrode 143, and may be positioned on the same layer. For example, the main source electrode 141, the main drain electrode 142, and the main gate electrode 143 may include a single metal material such as copper (Cu), aluminum (Al), molybdenum (Mo), or titanium (Ti), and in some cases, may include an alloying material such as molybdenum-titanium (MoTi).

Referring to FIG. 3, since the first sub-conductorization portion 121A and the second sub-conductorization portion 122A are formed in the semiconductor layer 120, the length of the channel portion 123 of the semiconductor layer 120 may be shortened. Accordingly, it may be easy to implement a short channel of the thin film transistor TFT. Accordingly, mobility of the thin film transistor TFT may be improved.

Figure 4:
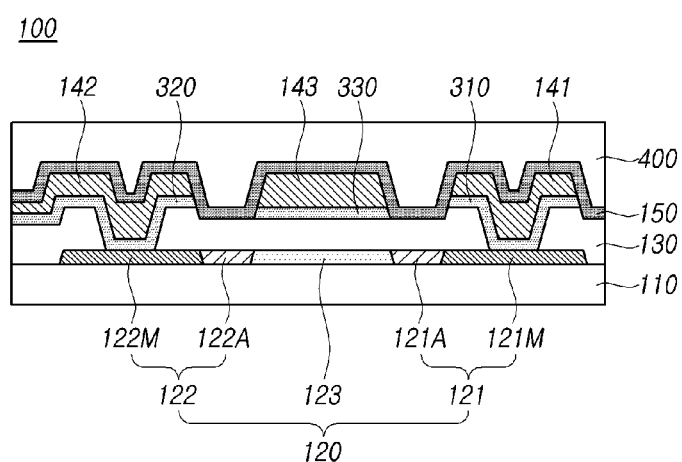
FIGS. 4 to 6 are cross-sectional views illustrating examples of positions of a functional insulating layer in a thin film transistor array substrate according to embodiments of the present disclosure.
Figure 5:
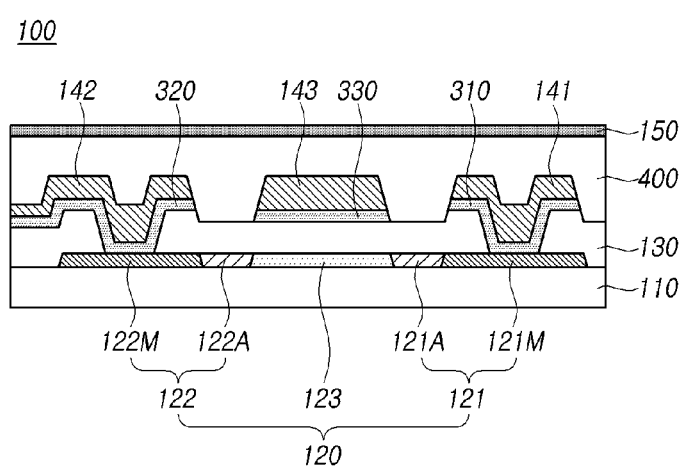
Figure 6:
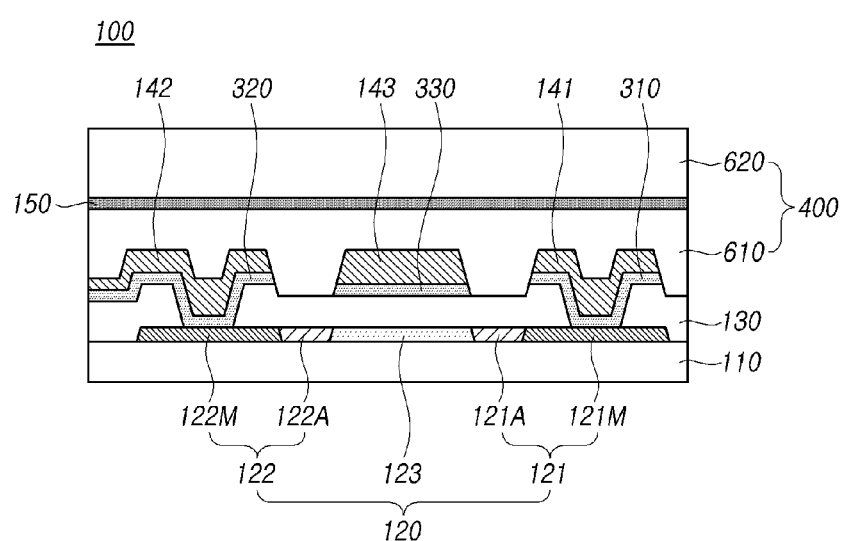

FIGS. 4 to 6 are cross-sectional views illustrating examples of positions of a functional insulating layer 150 in a thin film transistor array substrate 100 according to embodiments of the present disclosure.

Referring to FIG. 4 to FIG. 6, a thin film transistor array substrate 100 according to embodiments of the present disclosure may further include a passivation layer 400 which protects a thin film transistor TFT or electrically stabilizes the thin film transistor TFT. The passivation layer 400 may be disposed on the thin film transistor TFT. The passivation layer 400 is also referred to as a protection layer.

Referring to FIG. 4, the functional insulating layer 150 may be disposed under the passivation layer 400. In this case, the functional insulating layer 150 may be formed at an irregular height due to electrodes formed on the gate insulator layer 130.

Here, the electrodes formed on the gate insulator layer 130 may include a main source electrode 141, a first auxiliary source electrode 310, a main gate electrode 143, an auxiliary gate electrode 330, a main drain electrode 142, and a first auxiliary drain electrode 320.

Referring to FIG. 5, the functional insulating layer 150 may be disposed on the passivation layer 400. An upper surface of the passivation layer 400 may be flat or there may be no significant change in height. Therefore, the functional insulating layer 150 may be formed in a flat state on the passivation layer 400 or may be formed without a large change in height.

Referring to FIG. 6, the passivation layer 400 may include a plurality of sub-passivation layers 610 and 620. The functional insulating layer 150 may be positioned between the plurality of sub-passivation layers 610 and 620.

As described above, the functional insulating layer 150 may be positioned, based on the position of the passivation layer 400, below the passivation layer 400 as shown in FIG. 4, or may be disposed above the passivation layer 400 as shown in FIG. 5, or may be positioned between a plurality of passivation layers 400 (610, 620) as shown in FIG. 6.

However, as will be described later, when considering the hydrogen supply function of the functional insulating layer 150 and the hydrogen-conductorization of the first and second sub-conductorization portion 121A and 122A, compared to the cases of FIGS. 5 and 6, the case in which the functional insulating layer 150 is positioned under the passivation layer 400 as shown in FIG. 4 may be more advantageous since the distance in the vertical direction between the functional insulating layer 150 and the semiconductor layer 120 is less than the distance in the embodiments of FIGS. 5 and 6. Thus, the conduction performance of the first sub-conductorization portion 121A and the second sub-conductorization portion 122A by hydrogen supplied from the functional insulating layer 150 is improved in the example of FIG. 4.

Figure 7:
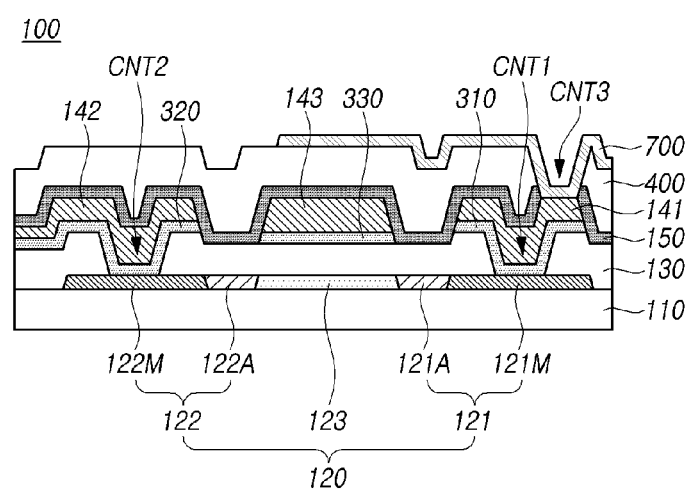
FIG. 7 is a cross-sectional view illustrating a thin film transistor and a pixel electrode formed on a thin film transistor array substrate according to embodiments of the present disclosure.

FIG. 7 is a cross-sectional view illustrating a thin film transistor TFT and a pixel electrode 700 formed on a thin film transistor array substrate 100 according to embodiments of the present disclosure.

Referring to FIG. 7, in a thin film transistor array substrate 100 according to embodiments of the present disclosure, a main source electrode 141, a main gate electrode 143, a main drain electrode 142, and a semiconductor layer 120 may constitute a thin film transistor TFT.

Referring to FIG. 7, a thin film transistor array substrate 100 according to embodiments of the present disclosure may further include a pixel electrode 700 electrically connected to the main source electrode 141 or the main drain electrode 142 of the thin film transistor TFT.

Referring to FIG. 7, a passivation layer 400 may be disposed on the main source electrode 141, the main gate electrode 143, and the main drain electrode 142, and may have a third contact hole CNT3 to expose a part of the main source electrode 141 or the main drain electrode.

Referring to FIG. 7, the pixel electrode 700 may be located on the passivation layer 400, and may electrically contact with the main source electrode 141 or the main drain electrode 142 exposed through the third contact hole CNT3.

In the example of FIG. 7, the pixel electrode 700 is connected to the main source electrode 141.

Referring to FIG. 7, a thin film transistor TFT in which the main source electrode 141 or the main drain electrode 142 is connected to the pixel electrode 700 may be a driving transistor included in each subpixel.

For example, the thin film transistor TFT may be a driving transistor for driving an organic light emitting diode in each subpixel of an organic light emitting diode (OLED) display device. Alternatively, the thin film transistor TFT may be a driving transistor connected to a pixel electrode in each subpixel of a liquid crystal display (LCD).

Figure 8:
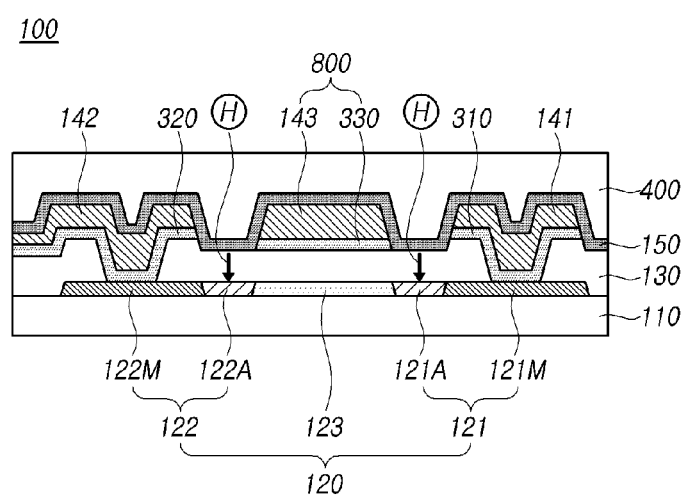
FIG. 8 is a cross-sectional view illustrating partial conductorization of a semiconductor layer by a functional insulating layer of a thin film transistor array substrate according to embodiments of the present disclosure.

FIG. 8 is a cross-sectional view illustrating partial conductorization of a semiconductor layer 120 by a functional insulating layer 150 of a thin film transistor array substrate 100 according to embodiments of the present disclosure.

Referring to FIG. 8, the functional insulating layer 150 of the thin film transistor array substrate 100 according to embodiments of the present disclosure may be a hydrogen supply layer containing hydrogen H.

The functional insulating layer 150 may be a hydrogen supply layer and may diffuse hydrogen H into the first sub-conductorization portion 121A and the second sub-conductorization portion 122A. Accordingly, in the semiconductor layer 120, the first sub-conductorization portion 121A and the second sub-conductorization portion 122A may be formed as a conductorized region.

Referring to FIG. 8, the first sub-conductorization portion 121A and the second sub-conductorization portion 122A may be also referred to as "hydrogen conductorization portion". The first main conductorization portion 121M and the second main conductorization portion 122M may be also referred to as "dry etching conductorization portions".

Referring to FIG. 8, the hydrogen concentration of the functional insulating layer 150 may be higher than that of the first sub-conductorization portion 121A and the second sub-conductorization portion 122A.

For example, the functional insulating layer 150 of the thin film transistor array substrate 100 according to embodiments of the present disclosure may include one or more of silicon nitride (SiNx), silicon oxynitride (SiON), and silicon oxide (SiOx).

Referring to FIG. 8, by the functional insulating layer 150 serving as a hydrogen supply layer, there may be an effect of reducing resistance in a region of the semiconductor layer 120 other than the first main conductorization portion 121M and the second main conductorization portion 122M, and forming regions with reduced resistance as the first sub-conductorization portion 121A and the second sub-conductorization portion 122A. In addition, the first sub-conductorization portion 121A and the second sub-conductorization portion 122A are formed by the functional insulating layer 150 serving as a hydrogen supply layer, so that there may be an effect of self-aligning the boundary between the first conductorization portion 121, the channel portion 123, and the second conductorization portion 122 in the semiconductor layer 120.

Referring to FIG. 8, the channel portion 123 of the thin film transistor IP 1 is a region in the semiconductor layer 120 that should not be conductive. Therefore, it is required to prevent the hydrogen H emitted from the functional insulating layer 150 from being excessively diffused into the channel portion 123. That is, it is necessary to prevent the channel portion 123 from being conductorized by hydrogen H emitted from the functional insulating layer 150.

To this end, the thin film transistor array substrate 100 according to embodiments of the present disclosure may include a hydrogen diffusion bather layer 800 between the functional insulating layer 150 and the channel portion 123.

Referring to FIG. 8, the hydrogen diffusion bather layer 800 may block diffusion of hydrogen from the functional insulating layer 150 to the channel portion 123. The hydrogen diffusion barrier layer 800 may include a main gate electrode 143. The hydrogen diffusion barrier layer 800 may further include an auxiliary gate electrode 330.

Figure 9:
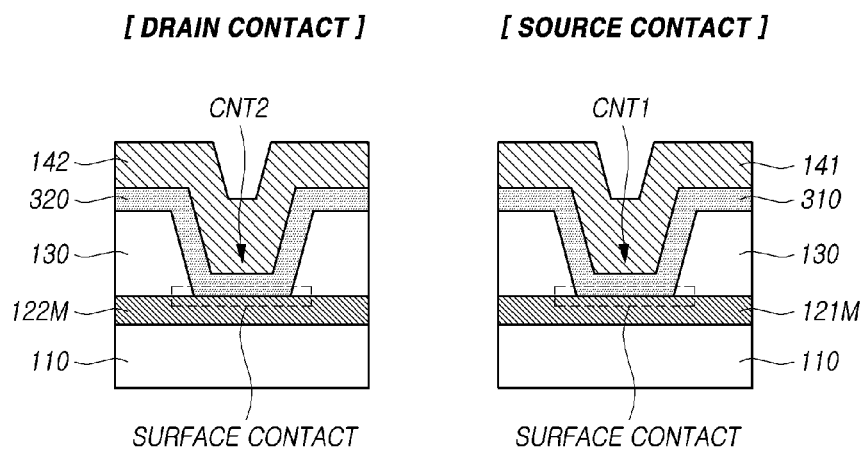
FIG. 9 is a diagram illustrating a surface contact structure between a first auxiliary source electrode and a first main conductorization portion and a surface between a first auxiliary drain electrode and a second main conductorization portion in the thin film transistor formed on the thin film transistor array substrate according to embodiments of the present disclosure.

FIG. 9 is a diagram illustrating a source contact and a drain contact in a thin film transistor TFT formed on the thin film transistor array substrate 100 according to embodiments of the present disclosure.

Referring to FIG. 9, for the source contact in the thin film transistor TFT, a first auxiliary source electrode 310 and a first main conductorization portion 121M may electrically contact each other. In this case, the first auxiliary source electrode 310 may be in surface contact with the first main conductorization portion 121M. That is, the lower surface of the first auxiliary source electrode 310 may contact the first main conductorization portion 121M.

Referring to FIG. 9, for the drain contact in the thin film transistor TFT, a first auxiliary drain electrode 320 and a second main conductorization portion 122M may electrically contact each other. The first auxiliary drain electrode 320 may be in surface contact with the second main conductorization portion 122M. That is, the lower surface of the first auxiliary drain electrode 320 may contact the first main conductorization portion 121M.

Accordingly, it is possible to stably provide the electrical connection between the first auxiliary source electrode 310 and the first main conductorization portion 121M and the electrical connection between the first auxiliary drain electrode 320 and the first main conductorization portion 121M. Accordingly, the operation performance of the thin film transistor TFT may be improved.

The thin film transistor array substrate 100 according to the embodiments of the present disclosure may be deformable. For example, the thin film transistor array substrate 100 according to embodiments of the present disclosure may be a flexible substrate, a bendable substrate, or a stretchable substrate.

In this case, in spite of the deformation of the thin film transistor array substrate 100, the thin film transistor TFT may perform a stable operation due to the surface contact between the first auxiliary source electrode 310 and the first main conductorization portion 121M and the surface contact between the first auxiliary drain electrode 320 and the first main conductorization portion 121M.

Figure 10:
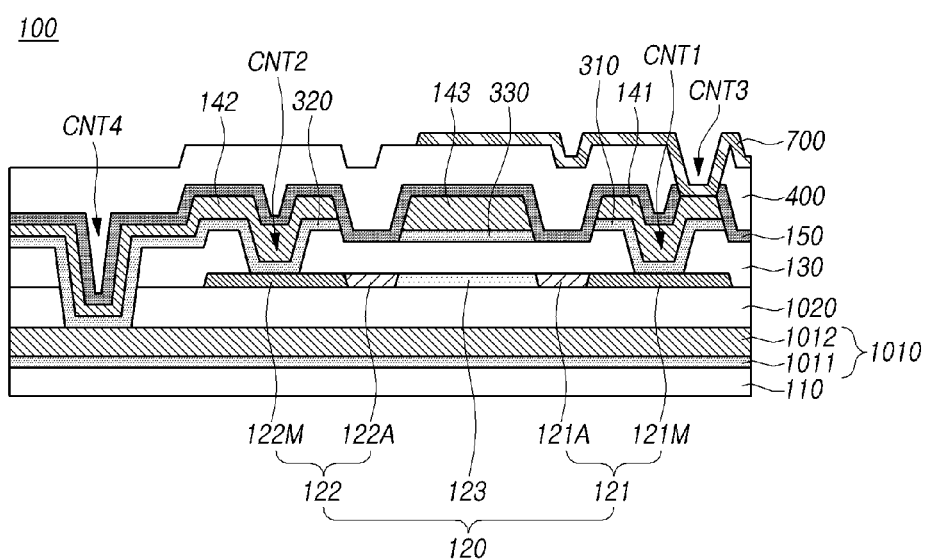
FIG. 10 is a cross-sectional view illustrating a thin film transistor and a light shield layer formed on a thin film transistor array substrate according to embodiments of the present disclosure.

FIG. 10 is a cross-sectional view illustrating a thin film transistor TFT and a light shield layer 1010 formed on a thin film transistor array substrate 100 according to embodiments of the present disclosure.

Referring to FIG. 10, a thin film transistor array substrate 100 according to embodiments of the present disclosure may further include a buffer layer 1020 disposed under a semiconductor layer 120 and a light shield layer 1010 disposed under the buffer layer 1020.

Referring to FIG. 10, the light shield layer 1010 may be disposed to overlap a channel portion 123 of the thin film transistor TFT.

If the channel portion 123 of the semiconductor layer 120 is exposed to light, the channel characteristics of the semiconductor layer 120 may change, and the operation characteristics of the thin film transistor TFT may also change.

Accordingly, since the light shield layer 1010 is disposed to overlap the channel portion 123 of the thin film transistor TFT, the exposure of the channel portion 123 to light may be prevented or at least reduced. Therefore, there may be provided with stable operation characteristics of the thin film transistor TFT.

Referring to FIG. 10, a first auxiliary source electrode 310 or a first auxiliary drain electrode 320 of a thin film transistor TFT may electrically contact the light shield layer 1010 through a fourth contact hole CNT4 penetrating a gate insulator layer 130 and the buffer layer 1020.

In the example of FIG. 10, the first auxiliary drain electrode 320 is in electrical contact with the light shield layer 1010 through the fourth contact hole CNT4. This is only for convenience of description, and the first auxiliary source electrode 310 may be in electrical contact with the light shield layer 1010 through the fourth contact hole CNT4.

As described above, since the first auxiliary source electrode 310 or the first auxiliary drain electrode 320 of the thin film transistor TFT is in electrical contact with the light shield layer 1010, the electrical characteristics (e.g., threshold voltage characteristics) of the thin film transistor TFT may be stabilized. For example, since the first auxiliary source electrode 310 or the first auxiliary drain electrode 320 of the thin film transistor TFT is in electrical contact with the light shield layer 1010, it is possible to reduce a phenomenon in which a threshold voltage corresponding to an intrinsic characteristic value of the thin film transistor TFT is abnormally shifted.

The light shield layer 1010 may be one layer. Alternatively, as shown in FIG. 10, the light shield layer 1010 may include two layers 1011 and 1012. In some cases, the light shield layer 1010 may include three or more layers.

Referring to FIG. 10, the light shield layer 1010 may include a main light shield layer 1012 and a sub light shield layer 1011. For example, the main light shield layer 1012 may include a single metal material such as copper (Cu), aluminum (Al), molybdenum (Mo), or titanium (Ti), and the sub light shield layer 1011 may include an alloy material such as molybdenum-titanium (MoTi).

The main light shield layer 1012 may be electrically connected to the first auxiliary source electrode 310 or the first auxiliary drain electrode 320. The sub light shield layer 1011 may be disposed under the main light shield layer 1012, and may electrically contact the main light shield layer 1012.

Figure 11:
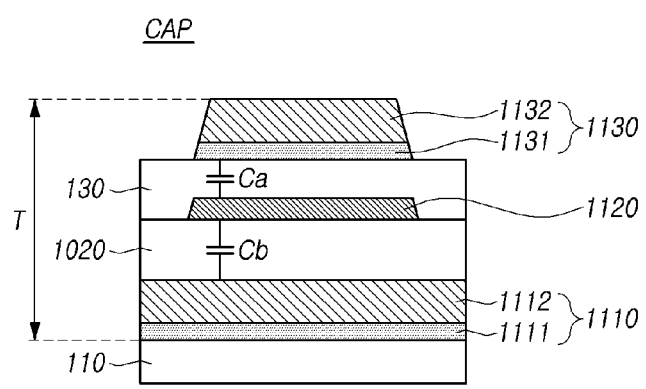
FIG. 11 is a cross-sectional view illustrating a structure of a capacitor formed on a thin film transistor array substrate according to embodiments of the present disclosure.

FIG. 11 is a cross-sectional view illustrating a structure of a capacitor CAP formed on a thin film transistor array substrate 100 according to embodiments of the present disclosure.

Referring to FIG. 11, a thin film transistor array substrate 100 according to embodiments of the present disclosure may further include a plurality of subpixels including a thin film transistor TFT and a capacitor CAP.

As described above, a thin film transistor TFT may include a semiconductor layer 120, a main source electrode 141, a main drain electrode 142, a main gate electrode 143, and the like.

Referring to FIG. 11, the capacitor CAP may include a first plate 1110, a second plate 1120 on the first plate 1110, and a third plate 1130 on the second plate 1120.

Referring to FIG. 11, the first plate 1110 and the third plate 1130 of the capacitor CAP may be metal plates. In contrast, the second plate 1120 of the capacitor CAP may be another semiconductor layer located on the same layer as the semiconductor layer 120 of the thin film transistor TFT and in a conductorized state.

Referring to FIG. 11, the first plate 1110 of the capacitor CAP may be a light shield layer 1010. Alternatively, the first plate 1110 of the capacitor CAP may be disposed on the same layer as the light shield layer 1010 and may be made of metal of the same material as the light shield layer 1010.

As shown in FIG. 10, in the case that the light shield layer 1010 includes a plurality of layers 1011 and 1012, the first plate 1110 of the capacitor CAP may also include a plurality of layers 1111 and 1112.

Referring to FIG. 11, the plurality of layers 1111 and 1112 included in the first plate 1110 may be formed of the same material as the plurality of layers 1011 and 1012 included in the light shield layer 1010, respectively.

Referring to FIG. 11, a first-1 plate 1111 among a first-1 plate 1111 and a first-2 plate 1112 included in the first plate 1110 may correspond to a position and a material of the sub light shield layer 1011 among the main light shield layer 1012 and the sub light shield layer 1011 included in the light shield layer 1010.

Referring to FIG. 11, the first-2 plate 1112 among the first-1 plate 1111 and the first-2 plate 1112 included in the first plate 1110 may correspond to a position and a material of the main light shield layer 1012 among the main light shield layer 1012 and the sub light shield layer 1011 included in the light shield layer 1010.

Referring to FIG. 11, the third plate 1130 may be the main gate electrode 143 and the auxiliary gate electrode 330, or may be metals disposed on the same layers as the main gate electrode 143 and the auxiliary gate electrode 330.

Referring to FIG. 11, the third plate 1130 may include a third-1 plate 1131 and a third-2 plate 1132.

Referring to FIG. 11, the third-1 plate 1131 of the third plate 1130 may be an auxiliary gate electrode 330. Alternatively, the third-1 plate 1131 of the third plate 1130 may be dispose on the same layer as the auxiliary gate electrode 330, and may be a metal of the same material as the auxiliary gate electrode 330.

Referring to FIG. 11, the third-2 plate 1132 of the third plate 1130 may be a main gate electrode 143. Alternatively, the third-2 plate 1132 of the third plate 1130 may be located on the same layer as the main gate electrode 143, and may be made of a metal of the same material as the main gate electrode 143.

Referring to FIG. 11, in the thin film transistor array substrate 100 according to embodiments of the present disclosure, the capacitor CAP may include a first capacitor Cb between the first plate 1110 and the second plate 1120 and a second capacitor Ca between the second plate 1120 and the third plate 1130.

Referring to FIG. 11, in the thin film transistor array substrate 100 according to embodiments of the present disclosure, the capacitor CAP has the above-described structure, so that the thickness T may be reduced. Hereinafter, it will be described a structural reason for reducing the thickness T of the capacitor CAP in the thin film transistor array substrate 100 according to embodiments of the present disclosure.

Since the thin film transistor array substrate 100 according to the embodiments of the present disclosure has a gate insulator layer etchless (GI Etchless) structure, the gate insulator layer 130 may be disposed while covering the second plate 1120 on the buffer layer 1020. Accordingly, the second capacitor Ca may be formed in a structure in which the gate insulator layer 130 is disposed between the second plate 1120 and the third plate 1130. If the thin film transistor array substrate 100 according to the embodiments of the present disclosure does not have the gate insulator layer etchless structure, a passivation layer 400 may be disposed while covering the second plate 1120 on the buffer layer 1020. In this case, the second capacitor Ca is inevitably formed in a structure in which the passivation layer 400 is exists between the second plate 1120 and the third plate 1130. Generally, the gate insulator layer 130 may be formed much thinner than the passivation layer 400. Accordingly, the thin film transistor array substrate 100 according to the embodiments of the present disclosure has the gate insulator layer etchless structure, so that the second capacitor Ca may be formed thinly in a structure in which the gate insulator layer 130 exists between the second plate 1120 and the third plate 1130. Consequently, the thickness T of the capacitor CAP may be reduced due to the gate insulator layer etchless structure.

In addition, in the thin film transistor array substrate 100 according to the embodiments of the present disclosure, the capacitor CAP is formed by overlapping three conductors 1110, 1120, and 1130, thereby increasing the capacitance. Therefore, it is not necessary to increase the area of the capacitor CAP in order to increase the capacitance. That is, since the area of the capacitor CAP may be designed to be small in order to obtain the same capacitance, the aperture ratio of the display panel can be increased.

Figure 12:
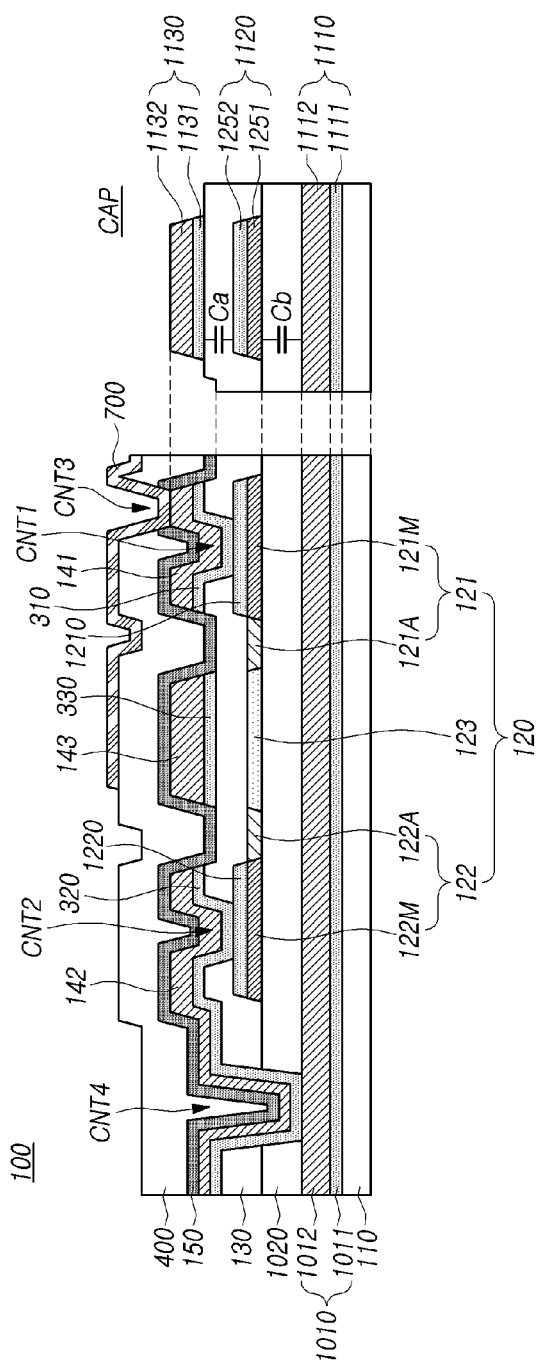
FIG. 12 is a cross-sectional view illustrating another structure of a thin film transistor formed on a thin film transistor array substrate according to embodiments of the present disclosure.

FIG. 12 is a cross-sectional view illustrating another structure of a thin film transistor TFT formed on a thin film transistor array substrate 100 according to embodiments of the present disclosure.

Referring to FIG. 12, a thin film transistor TFT formed on a thin film transistor array substrate 100 according to embodiments of the present disclosure may further include a second auxiliary source electrode 1210 and a second auxiliary drain electrode 1220. For example, the second auxiliary source electrode 1210 and the second auxiliary drain electrode 1220 may include an alloy material such as molybdenum-titanium (MoTi), or may include a single metal material such as copper (Cu), aluminum (Al), molybdenum (Mo), or titanium (Ti).

The second auxiliary source electrode 1210 may be disposed in contact with the upper surface of a first main conductorization portion 121M, and may electrically connect the first auxiliary source electrode 310 and the first main conductorization portion 121M.

The second auxiliary drain electrode 1220 may be disposed in contact with the upper surface of the second main conductorization portion 122M, and may electrically connect the first auxiliary drain electrode 320 and the second main conductorization portion 122M.

The second auxiliary source electrode 1210 may not overlap with an auxiliary gate electrode 330 and a first sub-conductorization portion 121A. The second auxiliary drain electrode 1220 may not overlap with the auxiliary gate electrode 330 and a second sub-conductorization portion 122A.

The second auxiliary source electrode 1210 may not be interposed between the functional insulating layer 150 and the first sub-conductorization portion 121A. The second auxiliary drain electrode 1220 may not be interposed between the functional insulating layer 150 and the second sub-conductorization portion 122A.

Accordingly, the first sub-conductorization portion 121A and the second sub-conductorization portion 122A may be formed in the semiconductor layer 120.

Hydrogen generated in the functional insulating layer 150 may diffuse to the surroundings.

Hydrogen generated in the functional insulating layer 150 may be blocked by the main source electrode 141, the first auxiliary source electrode 310, and the second auxiliary source electrode 1210, the main gate electrode 143, and the auxiliary gate electrode 330, and may be further blocked by the main drain electrode 142, the first auxiliary drain electrode 320 and the second auxiliary drain electrode 1220.

Hydrogen generated in the functional insulating layer 150 may be doped in a partial region of the semiconductor layer 120 where not covered by metal patterns. Some regions of the hydrogen-doped semiconductor layer 120 may be conductorized (hydrogen conductorized). Some regions of the hydrogen-doped semiconductor layer 120 may be the first sub-conductorization portion 121A and the second sub-conductorization portion 122A.

Referring to FIG. 12, the second auxiliary source electrode 1210 should not overlap with the auxiliary gate electrode 330. In that case, hydrogen conductorization does not occur in the partial region 121A of the semiconductor layer 120 and the first sub-conductorization portion 121A is not formed.

Referring to FIG. 12, the second auxiliary drain electrode 1220 should not overlap with the auxiliary gate electrode 330. In that case, hydrogen conductorization does not occur in the partial region 122A of the semiconductor layer 120 and the second sub-conductorization portion 122A is not formed.

Referring to FIG. 12, in the case that the second auxiliary source electrode 1210 is not disposed on the first main conductorization portion 121M and the second auxiliary drain electrode 1220 is not disposed on the second main conductorization portion 122M, if the gate insulator layer 130 is etched in order to connect the first main conductorization portion 121M to the first auxiliary source electrode 310 and connect the second main conductorization portion 122M to the first auxiliary drain electrode 320, there is a possibility that the first main conductorization portion 121M and the second main conductorization portion 122M may be damaged or broken.

However, as shown in FIG. 12, the second auxiliary source electrode 1210 is disposed on the first main conductorization portion 121M, and the second auxiliary drain electrode 1220 is disposed on the second main conductor portion 122M. In this state, the gate insulator layer 130 is etched in order to connect the first main conductorization portion 121M to the first auxiliary source electrode 310 and connect the second main conductorization portion 122M to the first auxiliary drain electrode 320, so that it is possible to prevent or at least reduce the first main conductorization portion 121M and the second main conductorization portion 122M from being damaged or broken by the second auxiliary source electrode 1210 and the second auxiliary drain electrode 1220.

Referring to FIG. 12, since the second auxiliary source electrode 1210 does not overlap the auxiliary gate electrode 330, the parasitic capacitance may not be formed between the second auxiliary source electrode 1210 and the auxiliary gate electrode 330.

In addition, since the second auxiliary drain electrode 1220 does not overlap with the auxiliary gate electrode 330, the parasitic capacitance may not be formed between the second auxiliary drain electrode 1220 and the auxiliary gate electrode 330. Accordingly, the performance of the thin film transistor TFT may be improved.

Referring to FIG. 12, the first sub-conductorization portion 121A and the second sub-conductorization portion 122A are formed in the semiconductor layer 120 by the hydrogen conductorization, so that the length of the channel portion 123 may be shortened. Accordingly, it may be easy to implement a short channel of the thin film transistor TFT. Accordingly, mobility of the thin film transistor TFT may be improved.

Meanwhile, in the case that the second auxiliary source electrode 1210 is disposed on the first main conductorization portion 121M, and the second auxiliary drain electrode 1220 is disposed on the second main conductorization portion 122M as shown in FIG. 12, the second plate 1120 of the capacitor CAP may be formed of the same material as the semiconductor layer 120 of the thin film transistor TFT, and may include another semiconductor layer 1251 in a conductorized state, as shown in FIG. 11. In addition, an additional metal layer 1252 may be further included on another semiconductor layer 1251. Here, the additional metal layer 1252 may be one of the second auxiliary source electrode 1210 and the second auxiliary drain electrode 1220, or may be a metal of the same material as the second auxiliary source electrode 1210 and the second auxiliary drain electrode 1220 and located on the same layer as the second auxiliary source electrode 1210 and the second auxiliary drain electrode 1220. For example, the additional metal layer 1252 may include an alloy material such as molybdenum-titanium (MoTi), and a single metal such as copper (Cu), aluminum (Al), molybdenum (Mo), or titanium (Ti).

Figure 13:
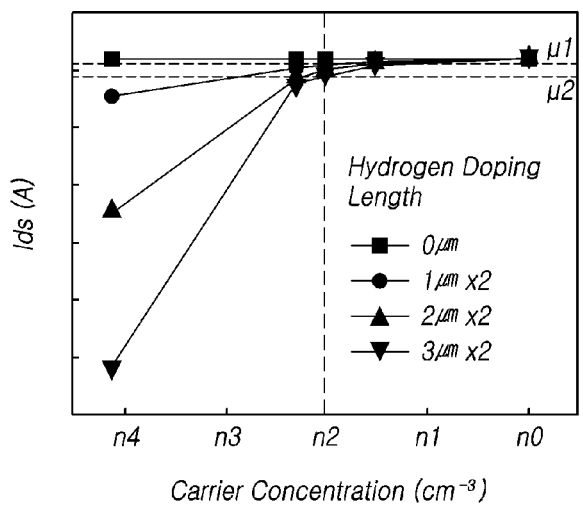
FIG. 13 is a graph illustrating a drain current according to a carrier concentration for each hydrogen doping length of a first sub-conductorization portion and a second sub-conductorization portion in a thin film transistor of a thin film transistor array substrate according to embodiments of the present disclosure.

FIG. 13 is a graph illustrating a drain current Ids which is an on-current according to a carrier concentration for each hydrogen doping length of a first sub-conductorization portion 121A and a second sub-conductorization portion 122A in a thin film transistor TFT of a thin film transistor array substrate 100 according to embodiments of the present disclosure.

Referring to FIG. 13, the x-axis of the graph represents the carrier concentration. The y-axis of the graph represents the current Ids flowing between the drain and the source of the thin film transistor TFT.

In the case that the functional insulating layer 150 of the thin film transistor 1H is a hydrogen supply layer, the first sub-conductorization portion 121A and the second sub-conductorization portion 122A of the thin film transistor TFT may be doped by hydrogen diffused from the functional insulating layer 150. Therefore, each of the length L1a of the first sub-conductorization portion 121A and the length L2a of the second sub-conductorization portion 122A of the thin film transistor TFT may correspond to a hydrogen doping length.

For four thin film transistors 1H s in which the first sub-conductorization portion 121A and the second sub-conductorization portion 122A have four hydrogen doping lengths, the result of measuring the current change according to the carrier concentration change is shown in FIG. 13.

The four hydrogen doping lengths may include 0 μm, 1 μm*2, 2 μm*2 and 3 μm*2.

The hydrogen doping length of 0w may mean that, in the thin film transistor TFT, the first sub-conductorization portion 121A and the second sub-conductorization portion 122A are not hydrogen-conductorized, but are dry-etched conductorization portion such as the first main conductorization portion 121M and the second main conductorization portion 122M. The hydrogen doping length of 1 μm*2 may mean that the length L1a of the first sub-conductorization portion 121A is 1 μm and the length L2a of the second sub-conductorization portion 122A is 1 μm in the thin film transistor TFT. The hydrogen doping length of 2 μm*2 may mean that the length L1a of the first sub-conductorization portion 121A is 2 μm and the length L2a of the second sub-conductorization portion 122A is 2 μm in the thin film transistor TFT. The hydrogen doping length of 3 μm*2 may mean that the length L1a of the first sub-conductorization portion 121A is 3 μm and the length L2a of the second sub-conductorization portion 122A is 3 μm in the thin film transistor TFT.

Referring to FIG. 13, in the case that the hydrogen doping length is 0 μm, the drain current Ids of the thin film transistor TFT does not change significantly even if the carrier concentration of the semiconductor layer 120 changes.

Referring to FIG. 13, however, in the case that the hydrogen doping length of each of the first sub-conductorization portion 121A and the second sub-conductorization portion 122A is 1 μm, 2 μm, and 3 μm, the drain current Ids of the thin film transistor TFT may be affected by the carrier concentration of the semiconductor layer 120.

Referring to FIG. 13, as the hydrogen doping length of each of the first sub-conductorization portion 121A and the second sub-conductorization portion 122A of the thin film transistor TFT increases, the drain current Ids of the thin film transistor TFT may be further affected by a change in carrier concentration.

Referring to FIG. 13, in the case that the hydrogen doping length of each of the first sub-conductorization portion 121A and the second sub-conductorization portion 122A is 1 μm, 2 μm, and 3 μm, and the carrier concentration of the semiconductor layer 120 changes within the range of n0 to n2, the drain current Ids of the thin film transistor TFT is not significantly affected by the carrier concentration of the semiconductor layer 120. Here, n0 may be a carrier concentration of the first main conductorization portion 121M and the second main conductorization portion 122M, which are dry-etched conductorization portions. For example, n0 may be $10^{20}$ cm$^{-3}$. n2 may be $10^{18}$ cm$^{-3}$.

Referring to FIG. 13, in the case that the hydrogen doping length of each of the first sub-conductorization portion 121A and the second sub-conductorization portion 122A of the thin film transistor TFT is 1 μm, 2 μm, and 3 μm, when the carrier concentration of the semiconductor layer 120 changes within a range less than n2, the drain current Ids of the thin film transistor TFT is greatly affected by the carrier concentration of the semiconductor layer 120. That is, as the carrier concentration of the semiconductor layer 120 decreases, the drain current Ids of the thin film transistor TFT further decreases.

Referring to FIG. 13, in the case that the hydrogen doping length of each of the first sub-conductorization portion 121A and the second sub-conductorization portion 122A of the thin film transistor TFT is 1 μm, 2 μm, and 3 μm, when the carrier concentration of the semiconductor layer 120 becomes smaller than n2, the drain current Ids of the thin film transistor TFT decreases as the carrier concentration of the semiconductor layer 120 decreases, so that the mobility of the thin film transistor TFT becomes smaller outside the desired mobility range (μ1 to μ2). Accordingly, the minimum carrier concentration value n2 capable of maintaining the mobility of the thin film transistor TFT within the desired mobility range (μ1~μ2) may be set as "an optimal carrier concentration" of each of the first sub-conductorization portion 121A and the second sub-conductorization portion 122A which have been hydrogen-conductorized.

Figure 14:
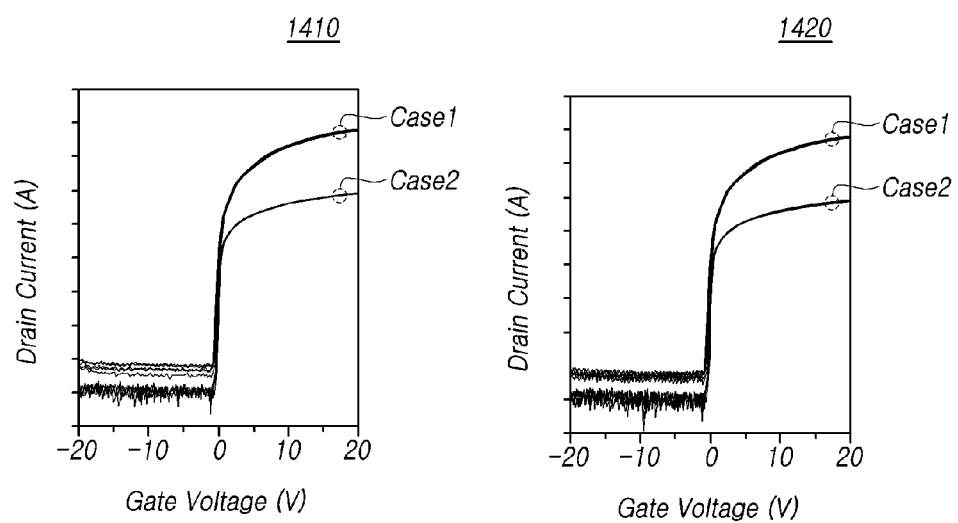
FIG. 14 is a graph illustrating a drain current according to a change in a gate voltage of a thin film transistor formed on a thin film transistor array substrate according to embodiments of the present disclosure.

FIG. 14 is a graph illustrating a drain current according to a change in a gate voltage of a thin film transistor TFT formed on a thin film transistor array substrate 100 according to embodiments of the present disclosure.

Referring to FIG. 14, a left graph 1410 illustrates a desired level of reference drain current according to a gate voltage change, and a right graph 1420 illustrates the drain current according to the gate voltage change in the case of the thin film transistor structure of FIG. 1 and the thin film transistor structure of FIG. 3.

Referring to FIG. 14, when performing experiments to measure the desired level of the reference drain current according to the gate voltage change for each of the case 1410 of not having a thin film transistor structure according to the embodiments of the present disclosure, but exhibiting a desired level of performance, and the case 1420 having a thin film transistor structure according to the embodiments of the present disclosure, the repeat experiments were conducted for two cases of a case 1 and a case 2. The first case (Case 1) is a case in which the drain-source voltage Vds of the thin film transistor 1H is a high voltage (e.g., 10V), and the second case (Case 2) is the case in which the drain-source voltage Vds of the thin film transistor TFT is a low voltage (e.g., 0.1V).

The thin film transistor structure of FIG. 1 may include a gate insulator layer etchless (GI Etchless) structure, and the semiconductor layer 120 may have a heterogeneous conductorization structure including the first sub-conductorization portion 121A and the second sub-conductorization portion 122A which have been hydrogen-conductorized in addition to the first main conductorization portion 121M and the second main conductorization portion 122M.

The thin film transistor structure of FIG. 3 may further include an auxiliary electrode structure including a first auxiliary source electrode 310 and a first auxiliary drain electrode 320 in addition to the thin film transistor structure of FIG. 1 (a gate insulator layer etchless structure, a heterogeneous conductorization structure).

Referring to FIG. 14, when comparing the left graph 1410 as a reference and the right graph 1420 related to the thin film transistor structure according to the embodiments of the present disclosure, it can be seen that the drain current according to the gate voltage was measured at a similar level.

Therefore, through the thin film transistor structure of FIG. 1 or the thin film transistor structure of FIG. 3, it is possible to prevent the semiconductor layer 120 of the thin film transistor TFT from being lost, and it is possible to maintain the drain current according to the gate voltage at the desired level, while preventing the damage of a source contact portion between the main source electrode 141 and the first main conductorization portion 121M in the thin film transistor TFT and a drain contact portion between the main drain electrode 142 and the second main conductorization portion 122M.

Here, the fact that the drain current according to the gate voltage is maintained at a desired level may mean that the thin film transistor TFT having the thin film transistor structure of FIG. 1 or the thin film transistor structure of FIG. 3 exhibits a desired level of switching characteristics (on-off characteristics) and mobility performance.

Figure 15:
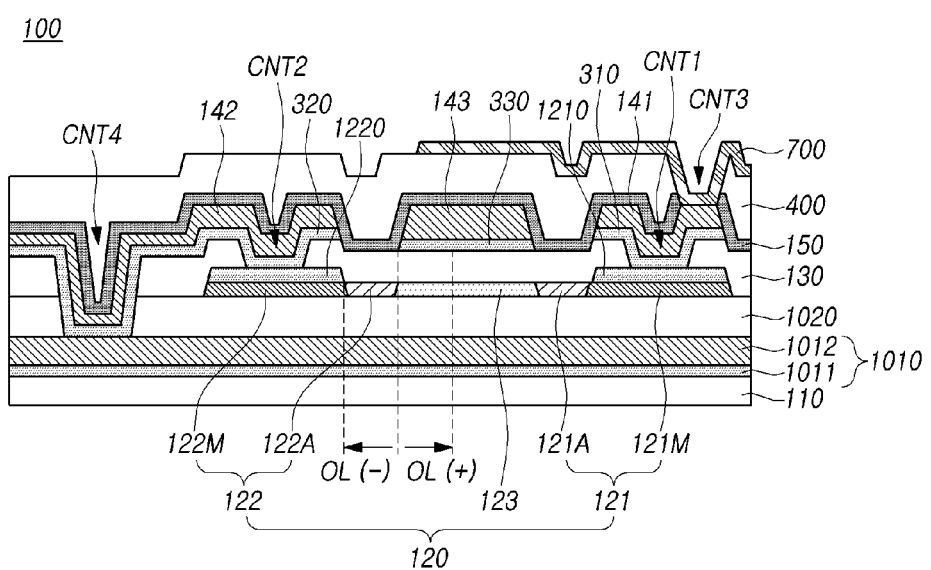
FIG. 15 is a cross-sectional view for explaining an overlap length between a second auxiliary source electrode and an auxiliary gate electrode and an overlap length between the second auxiliary drain electrode and the auxiliary gate electrode in a thin film transistor formed in a structure of FIG. 12 on a thin film transistor array substrate according to the embodiments of the present disclosure.
Figure 16:
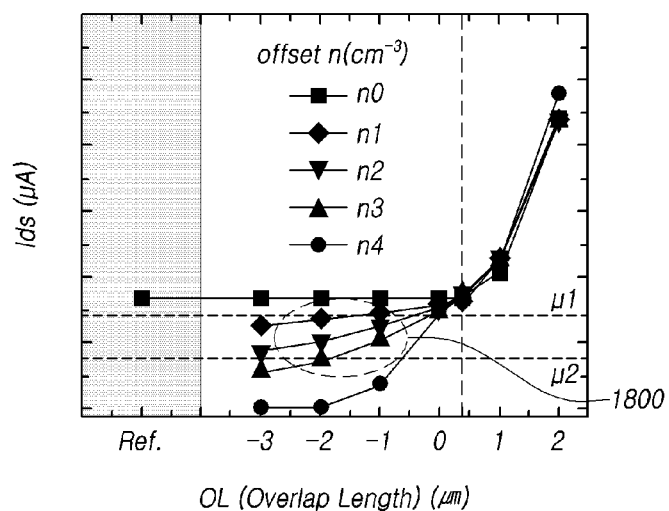
FIG. 16 is a graph illustrating a drain current according to a change in an overlap length for each carrier concentration in a thin film transistor formed in the structure of FIG. 12 on a thin film transistor array substrate according to the embodiments of the present disclosure.

FIG. 15 is a cross-sectional view for explaining an overlap length OL between a second auxiliary source electrode 1220 and an auxiliary gate electrode 330 and an overlap length OL between the second auxiliary drain electrode 1210 and the auxiliary gate electrode 330 in a thin film transistor TFT formed in a structure of FIG. 12 on a thin film transistor array substrate 100 according to the embodiments of the present disclosure. FIG. 16 is a graph illustrating a drain current according to a change in an overlap length OL for each carrier concentration in a thin film transistor TFT formed in the structure of FIG. 12 on a thin film transistor array substrate 100 according to the embodiments of the present disclosure.

FIG. 15 and FIG. 16 are diagrams for explaining the experimental results to determine a formation length L1a and L2a of the first sub-conductorization portion 121A and the second sub-conductorization portion 122A to be hydrogen conductorized, in order to form a gate insulator layer etchless structure and a heterogeneous conductorization structure while the characteristics (e.g., mobility, drain current, etc.) of the thin film transistor TFT and the semiconductor layer 120 have desired levels. The lengths L1a of the first sub-conductorization portion 121A may correspond to the separation distance between the second auxiliary source electrode 1210 and the auxiliary gate electrode 330, and the length L2a of the second sub-conductorization portion 122A may correspond to a separation distance between the second auxiliary drain electrode 1220 and the auxiliary gate electrode 330. In the following, for convenience of description, it will be described only the source region among the source region and the drain region.

Referring to FIG. 15 and FIG. 16, the fact that the overlap length OL has a positive value (+) means that the second auxiliary source electrode 1210 and the auxiliary gate electrode 330 overlaps each other.

Accordingly, hydrogen emitted from the functional insulating layer 150 is blocked by the second auxiliary source electrode 1210, so that hydrogen conductorization does not occur in the semiconductor layer 120. For this reason, the first sub-conductorization portion 121A may not be formed in the semiconductor layer 120.

Referring to FIG. 15 and FIG. 16, in the thin film transistor TFT formed in the structure of FIG. 12 on the thin film transistor array substrate 100 according to embodiments of the present disclosure, the overlap length OL between the second auxiliary source electrode 1210 and the auxiliary gate electrode 330 has a negative value (−).

Referring to FIG. 15 and FIG. 16, the fact that the overlap length OL has the negative value (−) means that the second auxiliary source electrode 1210 and the auxiliary gate electrode 330 do not overlap each other.

Referring to FIG. 15 and FIG. 16, the fact that the overlap length OL has the negative value (−) means that, as shown in FIG. 12, the second auxiliary source electrode 1210 and the auxiliary gate electrode 330 are horizontally spaced apart.

In addition, hydrogen emitted from the functional insulating layer 150 is not blocked by the second auxiliary source electrode 1210, and hydrogen conductorization occurs in the semiconductor layer 120, so that the first sub-conductorization portion 121A, which is a hydrogen-conductorized portion, may be formed in the semiconductor layer 120.

Referring to FIG. 15 and FIG. 16, in order to confirm the effect of the thin film transistor TFT having a structure in which the second auxiliary source electrode 1210 and the auxiliary gate electrode 330 do not overlap (that is, the overlap length OL has a negative value (−)), the drain current Ids is compared with respect to a thin film transistor TFT whose overlap length OL is a negative value (−) and a thin film transistor whose overlap length OL is a positive value (+).

The graph of FIG. 16 is a graph measuring the drain current for the case where the offset carrier concentration (n)

is n0, n1, n2, n3, n4, while changing the overlap length OL to 2 μm, 0 μm, −1 μm, −2 μm, −3 μm.

Here, the size relationship of the carrier concentration (n) is n0>n1>n2>n3>n4. n0 is the carrier concentration of the semiconductor layer 120 when hydrogen conductorization is not formed, and n1 to n4 are the carrier concentration of the semiconductor layer 120 when hydrogen conductorization is formed. For example, n0 may be $10^{20}$ cm$^{-3}$ and n2 may be $10^{18}$ cm$^{-3}$.

The case that the overlap length OL is 2 μm and 1 μm which are positive values (+) is a case in which the second auxiliary source electrode 1210 and the auxiliary gate electrode 330 overlap. In the case that the overlap length OL is 2 μm, the second auxiliary source electrode 1210 and the auxiliary gate electrode 330 may overlap by 2 μm. In the case that the overlap length OL is 1 μm, the second auxiliary source electrode 1210 and the auxiliary gate electrode 330 may overlap by 1 μm.

The case that the overlap length OL is negative value (−) of −1 μm, −2 μm, and −3 μm may correspond a case in which the second auxiliary source electrode 1210 and the auxiliary gate electrode 330 do not overlap.

In the case that the overlap length OL is −1 μm, the second auxiliary source electrode 1210 and the auxiliary gate electrode 330 are spaced apart by 1 μm. In the case that the overlap length OL is −2 μm, the second auxiliary source electrode 1210 and the auxiliary gate electrode 330 are separated by 2 μm. In the case that the overlap length OL is −3 μm, the second auxiliary source electrode 1210 and the auxiliary gate electrode 330 are separated by 3 μm.

In the case that the overlap length OL is −1 μm, the second auxiliary source electrode 1210 and the auxiliary gate electrode 330 are separated by 1 μm, so that the length L1a of the first sub-conductorization portion 121A may have a value of 1 μm or similar. In the case that the overlap length OL is −2 μm, the second auxiliary source electrode 1210 and the auxiliary gate electrode 330 are separated by 2 μm, so that the length L1a of the first sub-conductorization portion 121A may have a value of 2 μm or similar. In the case that the overlap length OL is −3 μm, the second auxiliary source electrode 1210 and the auxiliary gate electrode 330 are separated by 3 μm, so that the length L1a of the first sub-conductorization portion 121A may have a value of 3 μm or similar.

Referring to FIG. 16, in the case that the overlap length OL at which the second auxiliary source electrode 1210 and the auxiliary gate electrode 330 overlap is 0 (zero) or has a positive value (1 μm, 2 μm) greater than 0, the hydrogen conductorization does not occur in the semiconductor layer 120 of the thin film transistor TFT, and the thin film transistor TFT has a similar drain current Ids regardless of the size of the carrier concentration of the semiconductor layer 120.

Referring to FIG. 16, if the overlap length OL at which the second auxiliary source electrode 1210 and the auxiliary gate electrode 330 overlap increases from 0 to the positive direction (+) (i.e., 0 μm->1 μm->2 μm), the drain current Ids is significantly increased regardless of the size of the carrier concentration of the semiconductor layer 120.

Referring to FIG. 16, if the overlap length OL at which the second auxiliary source electrode 1210 and the auxiliary gate electrode 330 overlap increases from 0 to the negative direction (−), that is, if the separation distance between the second auxiliary source electrode 1210 and the auxiliary gate electrode 330 increases in the order of 1 μm, 2 μm, and 3 μm, the drain current Ids decreases. This reduction in drain current becomes more pronounced as the carrier concentration of the semiconductor layer 120 decreases.

Referring to FIG. 16, from the viewpoint of the magnitude of the drain current Ids of the thin film transistor TFT, in order to form a gate insulator layer etchless structure and a heterogeneous conductorization structure while having a desired level (e.g., a level where the mobility μ has a value in the range of μ1 to μ2) of characteristics (e.g., mobility, drain current, etc.) of the thin film transistor TFT and the semiconductor layer 120, the case 1800 in which the overlap length OL is −1 μm and −2 μm and the carrier concentration is n1, n2 and n3 may be appropriate.

In other words, in the case of forming a structure (a gate insulator layer etchless structure and heterogeneous conductorization structure) in which the second auxiliary source electrode 1210 and the auxiliary gate electrode 330 are designed so that the separation distance between the second auxiliary source electrode 1210 and the auxiliary gate electrode 330 is 1 μm and 2 μm, and the length L1a of the first sub-conductorization portion 122A is 1 μm and 2 μm, when the carrier concentration of the semiconductor layer 120 has n1, n2, and n3, the thin film transistor TFT and the semiconductor layer 120 may have a desired level of characteristics (e.g., a level in which the mobility μ has a value in the range of μ1 to μ2).

Figure 17:
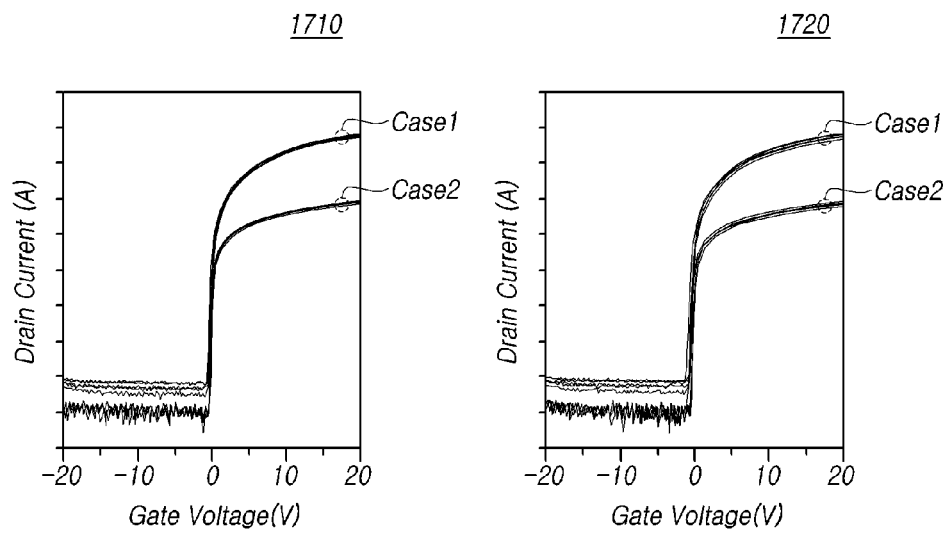
FIG. 17 is a graph illustrating a drain current according to a change in a gate voltage in a thin film transistor formed in the structure of FIG. 12 on a thin film transistor array substrate according to the embodiments of the present disclosure.

FIG. 17 is a graph illustrating a drain current according to a change in a gate voltage in a thin film transistor TFT formed in the structure of FIG. 12 on a thin film transistor array substrate 100 according to the embodiments of the present disclosure.

Referring to FIG. 17, a left graph 1710 illustrates a desired level of reference drain current according to a gate voltage change, and a right graph 1720 illustrates a drain current according to a gate voltage change in the case of having the thin film transistor structure of FIG. 12.

Referring to FIG. 17, when performing experiments to measure the desired level of the reference drain current according to the gate voltage change for each of the case 1710 of not having a thin film transistor structure according to the embodiments of the present disclosure, but exhibiting a desired level of performance, and the case 1720 having a thin film transistor structure according to the embodiments of the present disclosure, the repeat experiments were conducted for two cases of a case 1 and a case 2. The first case (Case 1) is a case in which the drain-source voltage Vds of the thin film transistor 1H is a high voltage (e.g., 10V), and the second case (Case 2) is the case in which the drain-source voltage Vds of the thin film transistor TFT is a low voltage (e.g., 0.1V).

The thin film transistor structure of FIG. 12 may include a gate insulator layer etchless (GI Etchless) structure, and the semiconductor layer 120 may have a heterogeneous conductorization structure including the first sub-conductorization portion 121A and the second sub-conductorization portion 122A which have been hydrogen-conductorized in addition to the first main conductorization portion 121M and the second main conductorization portion 122M, and may have a dual auxiliary electrode structure further including a second auxiliary source electrode 1210 and a second auxiliary drain electrode 1220.

Referring to FIG. 17, when comparing the left graph 1710 as a reference and the right graph 1720 related to the thin film transistor structure according to embodiments of the present disclosure, it can be seen that that the drain current according to the gate voltage was measured at a similar level.

Therefore, through the thin film transistor structure of FIG. 12, it is possible to prevent the semiconductor layer 120 of the thin film transistor TFT from being lost, and it is possible to maintain the drain current according to the gate voltage at the desired level, while preventing the damage of a source contact portion between the main source electrode 141 and the first main conductorization portion 121M in the thin film transistor TFT and a drain contact portion between the main drain electrode 142 and the second main conductorization portion 122M, and stably providing the hydrogen conductorization region.

Here, the fact that the drain current according to the gate voltage is maintained at a desired level may mean that the thin film transistor TFT having the thin film transistor structure of FIG. 12 exhibits a desired level of switching characteristics (on-off characteristics) and mobility performance.

Figure 18:
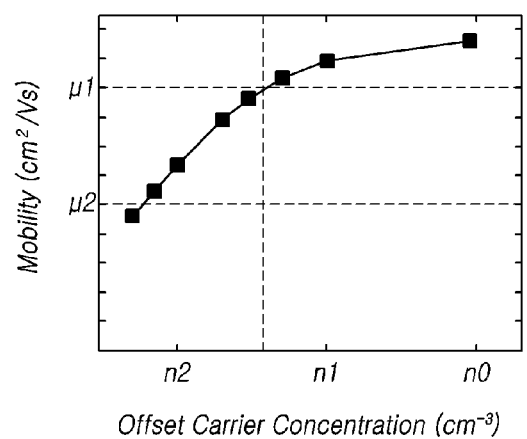
FIG. 18 is a graph illustrating mobility according to a change in carrier concentration in a thin film transistor formed on a thin film transistor array substrate according to embodiments of the present disclosure.

FIG. 18 is a graph illustrating mobility according to a change in carrier concentration in a thin film transistor TFT formed on a thin film transistor array substrate 100 according to embodiments of the present disclosure.

In the thin film transistor TFT formed on the thin film transistor array substrate 100 according to the embodiments of the disclosure, due to the gate insulator layer etchless structure and the heterogeneous conductorization structure of the semiconductor layer 120, it is possible to prevent the semiconductor layer 120 from being lost, and prevent the source contact and the drain contact in the semiconductor layer 120 from being damaged.

The thin film transistor TFT formed on the thin film transistor array substrate 100 according to the embodiments of the present disclosure may have a mobility μ in a desired range (μ1~μ2) while having the aforementioned advantages.

Referring to FIG. 18, even if the carrier concentration of the first sub-conductorization portion 121A and the second sub-conductorization portion 122A has a value in the range n1 to n2 smaller than n0 which is the carrier concentration of the first main conductorization portion 121M and the second main conductorization portion 122M, the thin film transistor TFT may have a mobility μ in a desired range (μ1 to μ2).

Figure 19:
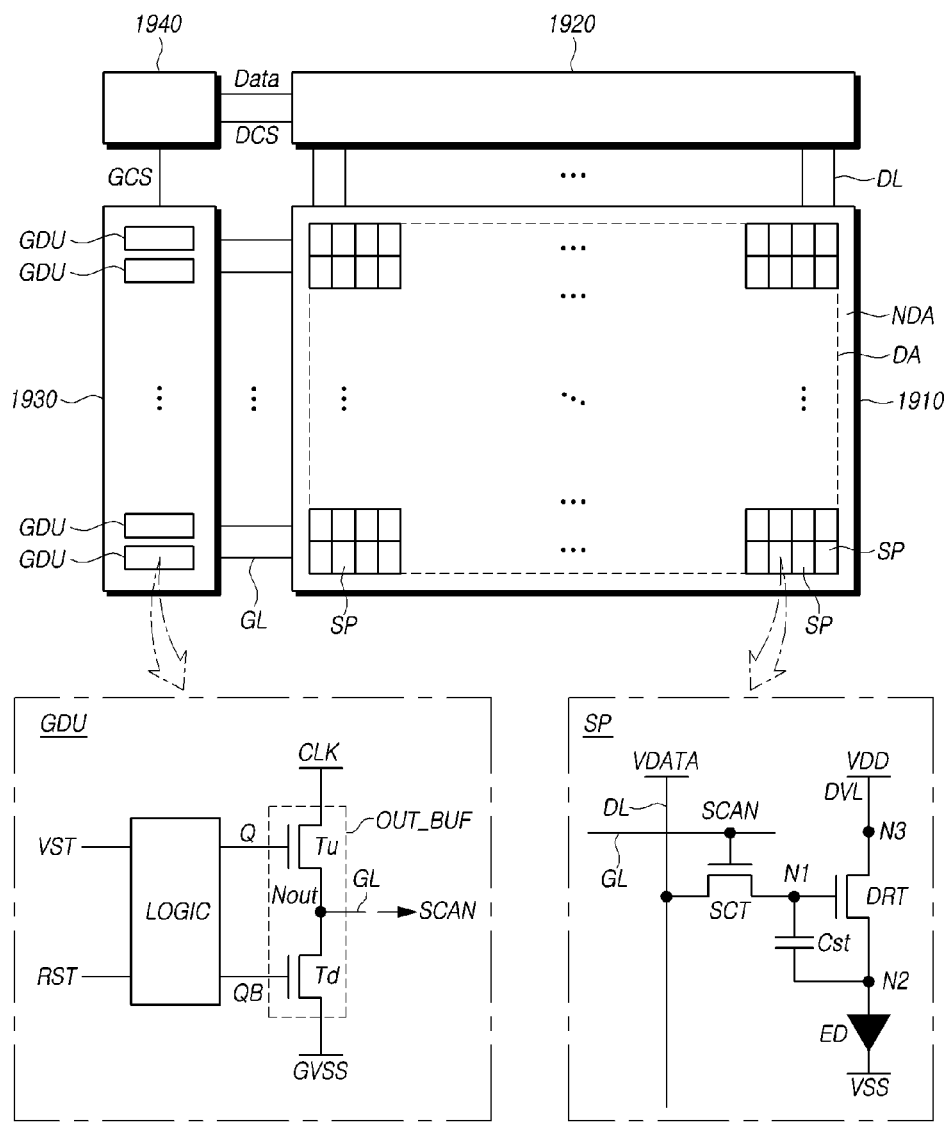
FIG. 19 is a diagram illustrating a display device according to embodiments of the present disclosure.

FIG. 19 is a diagram illustrating a display device according to embodiments of the present disclosure.

Referring to FIG. 19, a display device according to embodiments of the present disclosure may include a display panel 1910, a data driving circuit 1920, a gate driving circuit 1930, a controller 1940, and the like.

The display panel 1910 may include a display area DA and a non-display area NDA which is an area outside the display area DA. A plurality of data lines DL, a plurality of gate lines GL, and a plurality of subpixels SP may be disposed.

The data driving circuit 1920 may output data voltages VDATA to the plurality of data lines DL to drive the plurality of data lines DL.

The data driving circuit 1920 may be implemented in a tape carrier package (TCP) type, a chip on glass (COG) type, a chip on panel (COP) type, or a chip on film (COF) type.

In the case that the data driving circuit 1920 is implemented as the COG type or the COP type, the data driving circuit 1910 may be bonded to a pad portion formed in the non-display area NDA of the display panel 1910.

In the case that the data driving circuit 1920 is implemented in the COF type, the data driving circuit 1910 may be mounted on a circuit film, and one side of the circuit film may be bonded to the pad portion formed in the non-display area NDA.

The gate driving circuit 1930 may output scan signals SCAN to the plurality of gate lines GL in order to drive the plurality of gate lines GL.

The gate driving circuit 1930 may be implemented as a TCP type, a COG type, a COP type, a COF type, a gate-in-panel (GIP) type, and the like.

In the case that the gate driving circuit 1930 is implemented in a COG type or a COP type, the gate driving circuit 1930 may be bonded to a pad portion formed in the non-display area NDA of the display panel 1910.

In the case that the gate driving circuit 1930 is implemented in a COF type, the gate driving circuit 1930 may be mounted on a circuit film, and one side of the circuit film may be bonded to the pad portion formed in the non-display area NDA of the display panel 1910.

In the case that the gate driving circuit 1930 is implemented in a GIP type, the gate driving circuit 1930 may be formed in a partial area of the non-display area NDA of the display panel 1910. In the case that the gate driving circuit 1930 is implemented in a GIP type, the gate driving circuit 1930 may be formed together with other electrodes or lines in the display area DA during a manufacturing process of the display panel 1910.

The controller 1940 may control the data driving circuit 1920 and the gate driving circuit 1930.

The controller 1940 may supply various data driving control signals DCS for controlling data driving timing and image digital data Data to the data driving circuit 1920. The data driving circuit 1920 may convert the image digital data Data into a data voltage VDATA corresponding to an analog voltage, and may output the data voltage VDATA to the data line DL based on the data driving control signal DCS.

The controller 1940 may supply various gate driving control signals GCS for controlling gate driving timing and various signals required for generation of the scan signal SCAN to the gate driving circuit 1930. The gate driving circuit 1930 may output a scan signal SCAN having a turn-on level gate voltage at a predetermined timing to the gate line GL based on the gate driving control signal DCS.

The display device according to the embodiments of the present disclosure may be of various types, such as an organic light emitting diode (OLED) display, a quantum dot display, or a liquid crystal display (LCD). Referring to FIG. 19, if the display device according to the embodiments of the present disclosure is an organic light emitting diode (OLED) display device, each subpixel SP of the display panel 1910 may include a light emitting device ED, a driving transistor DRT, a scan transistor SCT, and a capacitor Cst.

The light emitting device ED may include a first electrode, a light emitting layer, and a second electrode. The light emitting layer may be disposed between the first electrode and the second electrode. The first electrode may be an anode electrode and the second electrode may be a cathode electrode. Conversely, the first electrode may be a cathode electrode and the second electrode may be an anode electrode. In the case that the second electrode is a cathode electrode, a base voltage VSS may be applied to the second electrode. For example, the base voltage VSS may be a ground voltage or a voltage similar to the ground voltage. For example, the light emitting device ED may be an organic light emitting diode (OLED), a light emitting diode (LED), a quantum dot light emitting device, or the like.

The driving transistor DRT is a transistor for driving the light emitting device ED, and may control a current flowing to the light emitting device ED.

The driving transistor DRT may include a first node N1, a second node N2, a third node N3, and the like. The first node N1 of the driving transistor DRT may be a gate node, and may be electrically connected to a source node or a drain node of the scan transistor SCT. The second node N2 of the driving transistor DRT may be electrically connected to the first electrode of the light emitting device ED, and may be a source node or a drain node. The third node N3 of the driving transistor DRT is a node to which the driving voltage VDD is applied, and may be electrically connected to the driving voltage line DVL supplying the driving voltage VDD, and may be a drain node or a source node.

The scan transistor SCT may control a connection between the first node N1 of the driving transistor DRT and the corresponding data line DL in response to the scan signal SCAN which is a gate signal supplied from the gate line GL.

A drain node or a source node of the scan transistor SCT may be electrically connected to a corresponding data line DL. The source node or drain node of the scan transistor SCT may be electrically connected to the first node N1 of the driving transistor DRT. The gate node of the scan transistor SCT may be electrically connected to the gate line GL to receive the scan signal SCAN.

The scan transistor SCT may be turned on by the scan signal SCAN of the turn-on level voltage, so that the data signal Vdata supplied from the corresponding data line DL may be transmitted to the first node N1 of the driving transistor DRT.

The scan transistor SCT may be turned on by the scan signal SCAN of the turn-on level voltage, and may be turned off by the scan signal SCAN of the turn-off level voltage. Here, in the case that the scan transistor SCT is an n-type, the turn-on level voltage may be a high level voltage, and the turn-off level voltage may be a low level voltage. In the case that the scan transistor SCT is a p-type, the turn-on level voltage may be a low level voltage and the turn-off level voltage may be a high level voltage.

The storage capacitor Cst may be electrically connected between the first node N1 and the second node N2 of the driving transistor DRT. The storage capacitor Cst may maintain the image data voltage Vdata corresponding to the image signal voltage or a voltage corresponding thereto for one frame time.

The storage capacitor Cst is not a parasitic capacitor (e.g., Cgs, Cgd) that is an internal capacitor existing between the first node N1 and the second node N2 of the driving transistor DRT. The storage capacitor Cst may be an external capacitor intentionally designed outside the driving transistor DRT.

Each of the driving transistor DRT and the scan transistor SCT may be an n-type transistor or a p-type transistor. Both the driving transistor DRT and the scan transistor SCT may be n-type transistors or p-type transistors. At least one of the driving transistor DRT and the scan transistor SCT may be an n-type transistor (or a p-type transistor) and the other may be a p-type transistor (or an n-type transistor).

The equivalent circuit of the subpixel SP illustrated in FIG. 19 is for illustration only, and may further include one or more transistors, or may further include one or more capacitors in some cases. Alternatively, each of the plurality of subpixels SP may have the same structure, or some of the plurality of subpixels SP may have a different structure.

Referring to FIG. 19, the gate driving circuit 1930 may include a plurality of gate driving units GDU in order to output scan signals SCAN to a plurality of gate lines GL.

Each of the plurality of gate driving units GUU may include a pull-up transistor Tu, a pull-down transistor Td, and a control logic unit LOGIC.

The pull-up transistor Tu and the pull-down transistor Td may be electrically connected in series between a node to which the clock signal CLK is input and a node to which the gate base voltage VSS is input.

The point where the pull-up transistor Tu and the pull-down transistor Td are connected is an output point Nout from which the scan signal SCAN is output, and is connected to the gate line GL.

At the timing when the pull-up transistor Tu is turned on and the pull-down transistor Td is turned off, the high level gate voltage corresponding to the clock signal CLK is applied to the output point Nout through the pull-up transistor Tu, so that the high level gate voltage may be output to the gate line GL connected to the output point Nout. Here, the high level gate voltage corresponds to the turn-on level voltage of the scan signal SCAN.

At the timing when the pull-up transistor Tu is turned off and the pull-down transistor Td is turned on, the low level gate voltage corresponding to the gate base voltage VSS is applied to the output point Nout through the pull-down transistor Td, so that the low level gate voltage may be output to the gate line GL connected to the output point Nout. Here, the low level gate voltage corresponds to the turn-off level voltage of the scan signal SCAN.

The control logic unit LOGIC may receive a start signal VST and a reset signal RST, may control a voltage of a Q node which is a gate node of the pull-up transistor Tu, and may control the voltage of the QB node which is the gate node of the pull-down transistor Td. The voltage at the Q node and the voltage at the QB node are opposite to each other. If the voltage at the Q node is a high level voltage, the voltage at the QB node is a low level voltage. If the voltage at the Q node is a low level voltage, the voltage at the QB node is a high level voltage.

The structures of the thin film transistor array substrate 100 and the thin film transistor TFT described above with reference to FIGS. 10 to 18 may include a heterogeneous conductorization structure, a hydrogen conductorization structure, a gate insulator layer etchless structure, and a structure of using the functional insulating layer 150

The structures of the thin film transistor array substrate 100 and the thin film transistor TFT described above with reference to FIGS. 10 to 18 may be applied to the driving transistor DRT and/or the scan transistor SCT in the subpixel SP, or may be applied to the pull-up transistor Tu and the pull-down transistor Td included in the gate driving unit GDU, or may be applied to transistors in the control logic unit LOGIC of the gate driving unit GDU.

Referring to FIG. 19, a display panel 1910 of a display device according to embodiments of the present disclosure may include a thin film transistor array substrate 100 on which a plurality of thin film transistors TFTs are disposed. At least one of the plurality of thin film transistors TFTs may include a semiconductor layer 120, a gate insulator layer 130, a main source electrode 141, a main drain electrode 142, a main gate electrode 143, and a functional insulating layer 150.

The semiconductor layer 120 may include a channel portion 123, a first conductorization portion 121 located on one side of the channel portion 123, and a second conductorization portion 122 located on the other side of the channel portion 123. The first conductorization portion 121 may include a first main conductorization portion 121M and a first sub-conductorization portion 121A. The second conductorization portion 122 may include a second main conductorization portion 122M and a second sub-conductorization portion 122A.

The gate insulator layer 130 may be positioned on the semiconductor layer 120 and may include a first contact hole CNT1 to expose a part of the first main conductorization portion 121M, and a second contact hole CNT2 to expose a part of the second main conductorization portion 122M.

The main source electrode 141 may be positioned on the gate insulator layer 130, and may be electrically connected to the first main conductorization portion 121M through the first contact hole CNT1. The main drain electrode 142 may be positioned on the gate insulator layer 130, and may be electrically connected to the second main conductorization portion 122M through the second contact hole CNT2. The main gate electrode 143 may be positioned on the gate insulator layer 130, and may overlap the channel portion 123.

The functional insulating layer 150 may be disposed on the main source electrode 141, the main gate electrode 143, and the main drain electrode 142.

The first sub-conductorization portion 121A may be positioned between the first main conductorization portion 121M and the channel portion 123. The first sub-conductorization portion 121A may not overlap the main source electrode 141 and the main gate electrode 143.

The second sub-conductorization portion 122A may be positioned between the second main conductorization portion 122M and the channel portion 123. The second sub-conductorization portion 122A may not overlap the main drain electrode 142 and the main gate electrode 143.

The first sub-conductorization portion 121A and the functional insulating layer 150 may be spaced apart by the gate insulator layer 130. The second sub-conductorization portion 122A and the functional insulating layer 150 may be spaced apart by the gate insulator layer 130.

The first sub-conductorization portion 121A may have electrical conductivity different from that of the first main conductorization portion 121M. The second sub-conductorization portion 122A may have different electrical conductivity than the second main conductorization portion 122M.

The embodiments of the present disclosure described above relate to the thin film transistor array substrate 100 and the display device, in which the semiconductor layer 120 has different types of conductorization portions (auxiliary source/second conductorization portions 121A, 122A, and main source/second conductorization portions 121M and 122M) having different electrical conductivity. In addition, it has a structure (a gate insulator layer etchless structure) in which the gate insulator layer 130 is not etched enough to expose the semiconductor layer 120 between the source electrode part (main source electrode 141) and the gate electrode part (main gate electrode 143) and between the drain electrode part (main drain electrode 142) and the gate electrode part (main gate electrode 143), so that it is possible to prevent the semiconductor layer 120 from being lost, damaged, or broken.

Furthermore, according to the embodiments of the present disclosure, since the gate insulator layer 130 is formed after respectively forming the second auxiliary source electrode 1210 and the second auxiliary drain electrode 1220 on the first main conductorization portion 121M and the second main conductorization portion 122M, and then the gate insulator layer 130 is etched to form the first contact hole CNT1 and the second contact hole CNT2, it is possible to prevent or minimize a risk of damage, loss, or disconnection of the first main conductorization portion 121M and the second main conductorization portion 122M.

Furthermore, according to the embodiments of the present disclosure, it is possible to provide a thin film transistor array substrate 100 and a display device including a thin film transistor TFT having a structure capable of simultaneously providing excellent electrical characteristics (e.g., current characteristics, mobility, etc.) while eliminating or reducing the possibility of damage to the semiconductor layer 120.

According to the embodiments of the present disclosure, it is possible to provide a thin film transistor array substrate 100 and a display device including a thin film transistor TFT having a structure in which the second auxiliary source electrode 1210 and the second auxiliary drain electrode 1220 are disposed while being in contact with each of the first and second main conductorization portion 121M and 122M, thus preventing the formation of parasitic capacitance.

According to the embodiments of the present disclosure, it is possible to provide a thin film transistor array substrate 100 and a display device capable of increasing an aperture ratio by having a structure capable of forming a capacitor CAP with a thin thickness.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A thin film transistor array substrate comprising:
a semiconductor layer including a channel portion, a first conductorization portion located at a first side of the channel portion, and a second conductorization portion located at a second side of the channel portion that is opposite the first side, wherein the first conductorization portion includes a first main conductorization portion and a first sub-conductorization portion, and the second conductorization portion includes a second main conductorization portion and a second sub-conductorization portion;
a gate insulator layer on the semiconductor layer and including a first contact hole and a second contact hole, the first contact hole exposing a portion of the first main conductorization portion and the second contact hole exposing a portion of the second main conductorization portion;
a main source electrode on the gate insulator layer, the main source electrode electrically connected to the first main conductorization portion through the first contact hole;
a main drain electrode on the gate insulator layer, the main drain electrode electrically connected to the second main conductorization portion through the second contact hole;
a main gate electrode on the gate insulator layer, the main gate electrode overlapping the channel portion; and a functional insulating layer on the main source electrode, the main gate electrode, and the main drain electrode, wherein the first sub-conductorization portion is located between the first main conductorization portion and the channel portion, the first sub-conductorization portion non-overlapping with the main source electrode and the main gate electrode and having an electrical conductivity different from an electrical conductivity of the first main conductorization portion, wherein the second sub-conductorization portion is located between the second main conductorization portion and the channel portion, the second sub-conductorization portion non-overlapping with the main drain electrode and the main gate electrode and having an electrical conductivity different from an electrical conductivity of the second main conductorization portion, and wherein the gate insulator layer is between the first sub-conductorization portion and the functional insulating layer, and is between the second sub-conductorization portion and the functional insulating layer, wherein a hydrogen concentration of the functional insulating layer is greater than a hydrogen concentration of the first sub-conductorization portion and a hydrogen concentration of the second sub-conductorization portion.

2. The thin film transistor array substrate of claim 1, wherein the electrical conductivity of the first main conductorization portion is greatest among electrical conductivities of the first main conductorization portion, the first sub-conductorization portion, and the channel portion, and an electrical conductivity of the channel portion is the least amongst the electrical conductivities of the first main conductorization portion, the first sub-conductorization portion, and the channel portion, and the electrical conductivity of the second main conductorization portion is greatest among electrical conductivites of the second main conductorization portion, the second sub-conductorization portion, and the channel portion, and the electrical conductivity of the channel portion is the least amongst the electrical conductivites of the second main conductorization portion, the second sub-conductorization portion, and the channel portion.

3. The thin film transistor array substrate of claim 1, wherein a vertical distance between the first sub-conductorization portion and the functional insulating layer is less than or equal to a vertical distance between the first main conductorization portion and the functional insulating layer, and a vertical distance between the second sub-conductorization portion and the functional insulating layer is less than or equal to a vertical distance between the second main conductorization portion and the functional insulating layer.

4. The thin film transistor array substrate of claim 1, wherein the main gate electrode and the main source electrode are spaced apart by a first horizontal distance such that a first upper surface of the gate insulator layer is exposed between the main gate electrode and the main source electrode, and the main gate electrode and the main drain electrode are spaced apart by a second horizontal distance such that a second upper surface of the gate insulator layer is exposed between the main gate electrode and the main source electrode, and wherein the first horizontal distance corresponds to a length of the first sub-conductorization portion, and the second horizontal distance corresponds to a length of the second sub-conductorization portion.

5. The thin film transistor array substrate of claim 4, wherein the functional insulating layer is overlapped by and in contact with the first upper surface of the gate insulator layer, and the functional insulating layer is overlapped by and in contact with the second upper surface of the gate insulator layer.

6. The thin film transistor array substrate of claim 1, further comprising:
a passivation layer disposed on the main source electrode, the main gate electrode, and the main drain electrode, the passivation layer having a third contact hole that exposes a portion of the main source electrode or the main drain electrode; and
a pixel electrode on the passivation layer, the pixel electrode in electrical contact with the main source electrode or the main drain electrode through the third contact hole.

7. The thin film transistor array substrate of claim 6, wherein the functional insulating layer is under the passivation layer.

8. The thin film transistor array substrate of claim 6, wherein the functional insulating layer is disposed on the passivation layer.

9. The thin film transistor array substrate of claim 6, wherein the passivation layer includes a plurality of sub-passivation layers, and the functional insulating layer is disposed between the plurality of sub-passivation layers.

10. The thin film transistor array substrate of claim 1, wherein the functional insulating layer is a hydrogen supply layer containing hydrogen, the functional insulating layer diffusing hydrogen into the first sub-conductorization portion and the second sub-conductorization portion.

11. The thin film transistor array substrate of claim 10, wherein the functional insulating layer includes at least one of silicon nitride (SiNx), silicon oxynitride (SiON), or silicon oxide (SiOx).

12. The thin film transistor array substrate of claim 10, further comprising:
a hydrogen diffusion barrier layer between the functional insulating layer and the channel portion, the hydrogen diffusion barrier layer blocking hydrogen diffusion from the functional insulating layer to the channel portion,
wherein the main gate electrode is included in the hydrogen diffusion barrier layer.

13. The thin film transistor array substrate of claim 1, further comprising:
a first auxiliary source electrode between the main source electrode and the first main conductorization portion, the first auxiliary source electrode electrically connecting the main source electrode to the first main conductorization portion through the first contact hole;
a first auxiliary drain electrode between the main drain electrode and the second main conductorization portion, the first auxiliary drain electrode electically connecting the main drain electrode to the second main conductorization portion through the second contact hole; and
an auxiliary gate electrode between the gate insulator layer and the main gate electrode, the auxiliary gate electrode electrically connected to the main gate electrode, and overlapping with the channel portion.

14. The thin film transistor array substrate of claim 13, wherein the first auxiliary source electrode is in contact with a surface of the first main conductorization portion, and the first auxiliary drain electrode is in contact with a surface of the second main conductorization portion.

15. The thin film transistor array substrate of claim 13, wherein the first auxiliary source electrode and the first auxiliary drain electrode include a same material as the auxiliary gate electrode and are located on a same layer of the thin film transistor array substrate, and the main source electrode and the main drain electrode include a same material as the main gate electrode and are located on a same layer of the thin film transistor array substrate.

16. The thin film transistor array substrate of claim 13, further comprising:
a buffer layer under the semiconductor layer; and
a light shield layer below the buffer layer,
wherein the first auxiliary source electrode or the first auxiliary drain electrode is electrically connected with the light shield layer through a fourth contact hole, the fourth contact hole through the gate insulator layer and the buffer layer.

17. The thin film transistor array substrate of claim 16, further comprising a plurality of subpixels including a thin film transistor and a capacitor, wherein,
the thin film transistor includes the semiconductor layer, the main source electrode, the main drain electrode, and the main gate electrode,
the capacitor includes a first plate, a second plate on the first plate, and a third plate on the second plate,
the first plate is the light shield layer or a metal disposed on a same layer as the light shield layer,
the second plate is another semiconductor layer located on a same layer as the semiconductor layer and in a conductorized state, and
the third plate is the main gate electrode and the auxiliary gate electrode, or is metal positioned on a same layer as the main gate electrode and the auxiliary gate electrode.

18. The thin film transistor array substrate of claim 13, further comprising:
a second auxiliary source electrode in contact with an upper surface of the first main conductorization portion, the second auxiliary source electrode electrically connecting the first auxiliary source electrode to the first main conductorization portion; and
a second auxiliary drain electrode in contact with an upper surface of the second main conductorization portion, the second auxiliary drain electrode electrically connecting the first auxiliary drain electrode to the second main conductorization portion,
wherein the second auxiliary source electrode is non-overlapping with the auxiliary gate electrode and the first sub-conductorization portion, and the second auxiliary drain electrode is non-overlapping with the auxiliary gate electrode and the second sub-conductorization portion.

19. A display device comprising a plurality of thin film transistors,
wherein at least one of the plurality of thin film transistors comprises the thin film transistor array substrate of claim 1.

20. A thin film transistor array substrate comprising:
a semiconductor layer including a channel portion, a first main conductorization portion at a first side of the channel portion, a second main conductorization portion at a second side of the channel portion that is opposite the first side, a first sub-conductorization portion between the first main conductorization portion and the channel portion, and a second sub-conductorization portion between the second main conductorization portion and the channel portion;
a source electrode electrically connected to the first main conductorization portion;
a drain electrode electrically connected to the second main conductorization portion; and
a gate electrode between the source electrode and the drain electrode, the gate electrode overlapping the channel portion;
wherein an electrical conductivity of the first sub-conductorization portion is different from an electrical conductivity of the first main conductorization portion, and an electrical conductivity of the second sub-conductorization portion is different from an electrical conductivity of the second main conductorization portion, and
wherein the electrical conductivity of the first main conductorization portion is greater than the electrical conductivities of the first sub-conductorization portion and the channel portion, and the electrical conductivity of the second main conductorization portion is greater than the electrical conductivities of the second sub-conductorization portion and the channel portion.

21. The thin film transistor array substrate of claim 20, wherein the gate electrode is non-overlapping with the first sub-conductorization portion and the second sub-conductorization portion.

22. The thin film transistor array substrate of claim 21, wherein the source electrode overlaps the first main conductorization portion but is non-overlapping with the first sub-conductorization portion, and the drain electrode overlaps the second main conductorization portion but is non-overlapping with the second sub-conductorization portion.

23. The thin film transistor array substrate of claim 22, further comprising:
a functional insulating layer on the source electrode, the drain electrode, and the gate electrode, the functional insulating layer having a hydrogen concentration that is greater than a hydrogen concentration of the first sub-conductorization portion and a hydrogen concentration of the second sub-conductorization portion, wherein the functional insulating layer overlaps the first sub-conductorization portion and the first sub-conductorization portion, and
a gate insulation layer on the semiconductor layer, the gate insulation layer between the first sub-conductorization portion and the functional insulating layer, and between the second sub-conductorization portion and the functional insulating layer.

24. The thin film transistor array substrate of claim 23, wherein the functional insulating layer also overlaps the first main conductorization portion and the second main conductorization portion, wherein a distance between the first main conductorization portion and a first portion of the functional insulating layer that overlaps the first main conductorization portion is greater than a distance between the first sub-conductorization portion and a second portion of the functional insulating layer that overlaps the first sub-conductorization portion, and
wherein a distance between the second main conductorization portion and a third portion of the functional insulating layer that overlaps the second main conductorization portion is greater than a distance between the second sub-conductorization portion and a fourth portion of the functional insulating layer that overlaps the second sub-conductorization portion.

* * * * *